United States Patent
Ha et al.

(10) Patent No.: US 9,792,974 B2
(45) Date of Patent: Oct. 17, 2017

(54) MEMORY SYSTEM INCLUDING PLURALITY OF DRAM DEVICES OPERATING SELECTIVELY

(71) Applicant: SAMSUNG ELECTRONICS CO., LTD., Suwon-si (KR)

(72) Inventors: Taewoong Ha, Busan (KR); Byungchul Ko, Hwaseong-si (KR); Daekyoung Kim, Seoul (KR); Jonghwan Kim, Suwon-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 14/966,039

(22) Filed: Dec. 11, 2015

(65) Prior Publication Data

US 2016/0217847 A1    Jul. 28, 2016

(30) Foreign Application Priority Data

Jan. 26, 2015  (KR) .......................... 10-2015-0012147

(51) Int. Cl.
| | | |
|---|---|---|
| G11C 7/00 | (2006.01) | |
| G11C 11/406 | (2006.01) | |
| G11C 11/4076 | (2006.01) | |
| G11C 11/4093 | (2006.01) | |
| G11C 7/10 | (2006.01) | |

(52) U.S. Cl.
CPC ...... *G11C 11/40615* (2013.01); *G11C 7/1045* (2013.01); *G11C 11/4076* (2013.01); *G11C 11/4093* (2013.01); *G11C 2211/4067* (2013.01)

(58) Field of Classification Search
CPC ............ G11C 11/40615; G11C 7/1045; G11C 11/4076; G11C 11/4093; G11C 2211/4067; G06F 13/4234
USPC .......................... 365/22, 189.11, 189.17, 222
See application file for complete search history.

(56) References Cited

U.S. PATENT DOCUMENTS

| | | | |
|---|---|---|---|
| 5,966,725 A | * | 10/1999 | Tabo .................... G06F 13/1636 365/222 |
| 6,478,231 B1 | | 11/2002 | Taussig |
| 7,126,873 B2 | | 10/2006 | See et al. |
| 7,450,410 B2 | | 11/2008 | Klein |
| 8,154,946 B2 | | 4/2012 | Park |
| 8,271,827 B2 | | 9/2012 | Bilger et al. |

(Continued)

FOREIGN PATENT DOCUMENTS

| | | |
|---|---|---|
| JP | 2000-105726 A | 4/2000 |
| JP | 2001-125828 A | 5/2001 |
| KR | 10-0451799 B1 | 10/2004 |

*Primary Examiner* — Tha-O H Bui
(74) *Attorney, Agent, or Firm* — Sughrue Mion, PLLC

(57) ABSTRACT

A memory system including a plurality of dynamic random access memory (DRAM) devices and a DRAM controller is provided. The plurality of DRAM devices includes one or more DRAM groups. Each of the one or more DRAM groups includes at least two DRAM devices. The DRAM controller outputs a clock enable signal, and controls a selection signal used to select a target DRAM device that operates in a normal mode in response to the clock enable signal. At least one target DRAM device is selected from the one or more DRAM groups. One or more stand-by DRAM devices other than the at least one target DRAM device operates in a self-refresh mode.

20 Claims, 13 Drawing Sheets

(56) References Cited

U.S. PATENT DOCUMENTS

| | | | |
|---|---|---|---|
| 8,325,551 B2* | 12/2012 | Choi | G11C 5/148 |
| | | | 365/222 |
| 8,332,607 B2 | 12/2012 | Tsai et al. | |
| 8,593,849 B2 | 11/2013 | Jeddeloh | |
| 8,788,747 B2 | 7/2014 | Ahn et al. | |
| 2004/0093461 A1* | 5/2004 | Kim | G11C 11/406 |
| | | | 365/222 |
| 2005/0286284 A1 | 12/2005 | See et al. | |
| 2007/0127282 A1 | 6/2007 | Klein | |
| 2008/0316823 A1 | 12/2008 | Chen et al. | |
| 2009/0150710 A1 | 6/2009 | Bilger et al. | |
| 2010/0030933 A1 | 2/2010 | Tsai et al. | |
| 2010/0177583 A1* | 7/2010 | Koshizuka | G11C 5/04 |
| | | | 365/222 |
| 2010/0232197 A1 | 9/2010 | Park | |
| 2011/0047318 A1 | 2/2011 | Dmitroca | |
| 2011/0060862 A1 | 3/2011 | Warren | |
| 2011/0145493 A1 | 6/2011 | Ahn et al. | |
| 2013/0083585 A1 | 4/2013 | Jeddeloh | |

\* cited by examiner

MEMORY SYSTEM INCLUDING PLURALITY OF DRAM DEVICES OPERATING SELECTIVELY

CROSS-REFERENCE TO RELATED APPLICATIONS

This application claims priority under 35 U.S.C. §119 to Korean Patent Application No. 10-2015-0012147 filed on Jan. 26, 2015, in the Korean Intellectual Property Office, the entire content of which is incorporated herein by reference.

BACKGROUND

1. Technical Field

Apparatuses and methods consistent with exemplary embodiments relate to a memory, and more particularly, relate to a memory system including a dynamic random access memory (DRAM).

2. Description of the Related Art

Memories may be classified as nonvolatile memory and volatile memory. Nonvolatile memory retains data regardless of whether power is supplied. On the other hand, volatile memory loses stored data when power is not supplied. However, volatile memory generally has faster access time. Accordingly, volatile memory may be used as a working memory, a buffer memory, or an operation memory of a computing device or an electronic system.

A DRAM is one type of volatile memory. The DRAM may perform a refresh operation to maintain data during an operation. DRAM may be fabricated at a relatively low cost and may operate at very high frequencies. Accordingly, a computing device or an electronic system being widely used may employ one or more DRAMs as a working memory or a buffer memory to perform a lot of operations.

To this end, a DRAM system having a large buffering capacity is required. In order to increase the buffering capacity of the DRAM system, the DRAM system may include a lot of DRAM devices. However, due to a design limit, a DRAM controller which controls an overall operation of the DRAM system may recognize the limited number of DRAM devices or may support a DRAM system having a limited capacity.

Accordingly, it is necessary to redesign a DRAM controller to address the limited buffering capacity supported by the DRAM controller. However, redesigning the DRAM controller takes a long time and requires a heavy cost.

SUMMARY

One or more exemplary embodiments provide a memory system configured to address the limit of the buffer capacity, without redesigning a DRAM controller. A plurality of DRAM devices included in the memory system may selectively operate in response to a selection signal.

According to an aspect of an exemplary embodiment, a memory system is provided. The memory system includes a plurality of DRAM devices and a DRAM controller. The plurality of DRAM devices may include one or more DRAM groups. Each of the one or more DRAM groups may include at least two DRAM devices. The DRAM controller may output a clock enable signal, and may control a selection signal used to select a target DRAM device that operates in a normal mode in response to the clock enable signal. One target DRAM device may be selected from each of the one or more DRAM groups. One or more stand-by DRAM devices other than one or more target DRAM devices respectively selected from the one or more DRAM groups may operate in a self-refresh mode.

The memory system may further include a selection circuit configured to receive the clock enable signal from the DRAM controller, and to provide the clock enable signal to the one or more target DRAM devices in response to the selection signal.

According to an aspect of another exemplary embodiment, a memory system is provided. The memory system includes a plurality of DRAM devices and a DRAM controller. The plurality of DRAM devices may include one or more DRAM groups. Each of the one or more DRAM groups may include at least two DRAM devices. The DRAM controller may output a clock enable signal, and control one or more selection signals. Each of the one or more selection signals may be used to select a target DRAM device that operates in a normal mode in response to the clock enable signal. One target DRAM device may be selected from a corresponding one of the one or more DRAM groups. One or more stand-by DRAM devices other than one or more target DRAM devices respectively selected from the one or more DRAM groups may operate in a self-refresh mode.

The memory system may further include one or more selection circuits. Each of the one or more selection circuits may receive the clock enable signal from the DRAM controller. The one or more selection circuits may provide the clock enable signal to the one or more target DRAM devices, respectively, in response to the one or more selection signals.

According to an aspect of another exemplary embodiment, a memory system is provided. The memory system includes a plurality of DRAM devices and a DRAM controller. The plurality of DRAM devices may include one or more DRAM groups. Each of the one or more DRAM groups may include at least two DRAM devices. The DRAM controller may control one or more selection signals. Each of the one or more selection signals may be used to select a target DRAM device that operates in a normal mode in response to a clock enable signal. One target DRAM device may be selected from a respective one of the one or more DRAM groups. The DRAM controller may provide the clock enable signal to one or more target DRAM devices respectively selected from the one or more DRAM groups. The DRAM controller may include one or more selection circuits configured to provide the clock enable signal to the one or more target DRAM devices, respectively, in response to the one or more selection signals. One or more stand-by DRAM devices other than the one or more target DRAM devices may operate in a self-refresh mode.

According to an aspect of another exemplary embodiment, a memory system is provided. The memory system includes: a selection circuit comprising a plurality of selectors configured to select target dynamic random access memory (DRAM) devices from among a plurality of (DRAM) devices; a DRAM controller configured to output a clock enable signal to the selection circuit and output a selection signal to select the target DRAM devices, wherein the plurality of selectors is configured to select the target DRAM devices in response to the selection signal, wherein the target DRAM devices are configured to operate in a normal mode in response to the clock enable signal, and wherein one or more stand-by DRAM devices other than the target DRAM devices are configured to operate in a self-refresh mode.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION OF EXEMPLARY EMBODIMENTS

Figure 1:
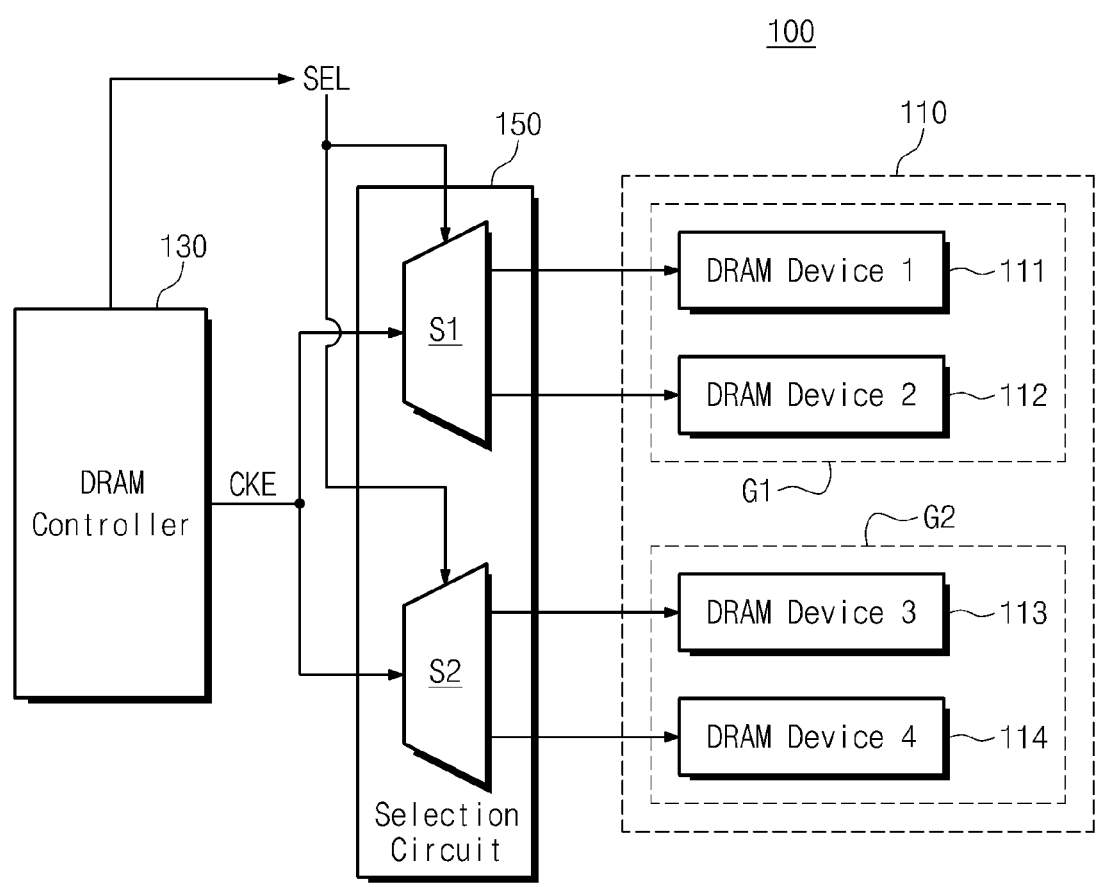
FIG. 1 is a block diagram illustrating a memory system according to an exemplary embodiment.

Exemplary embodiments will be described in detail with reference to the accompanying drawings. The present disclosure, however, may be embodied in various different forms, and should not be construed as being limited only to the illustrated embodiments. Rather, these exemplary embodiments are provided as examples so that the present disclosure will be thorough and complete, and will fully convey the concept of the present disclosure to those skilled in the art. Accordingly, known processes, elements, and techniques are not described with respect to some of the exemplary embodiments. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The terminology used herein is for the purpose of describing particular exemplary embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. The term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a memory system according to an exemplary embodiment. A memory system 100 may include a plurality of dynamic random access memory (DRAM) devices 110, a DRAM controller 130, and a selection circuit 150. The memory system 100 may be used as a working memory, a buffer memory, or an operation memory of a computing device or an electronic system.

The plurality of DRAM devices 110 may include one or more DRAM groups. For instance, the plurality of DRAM devices 110 may include two DRAM groups G1 and G2. One DRAM group may include at least two DRAM devices. For instance, a first DRAM group G1 may include two DRAM devices 111 and 112, and a second DRAM group G2 may include two DRAM devices 113 and 114.

However, the present disclosure is not limited to a configuration illustrated in FIG. 1. For instance, the plurality of DRAM devices 110 may include one DRAM group or three or more DRAM groups. For instance, one DRAM group may include three or more DRAM devices. A configuration illustrated in FIG. 1 is provided to help understanding of the present disclosure. The number of DRAM groups and the number of DRAM devices per DRAM group may be variously changed or modified.

The DRAM controller 130 may control overall operations of the memory system 100. The DRAM controller 130 may exchange various command signals and data signals with the DRAM devices 110. For instance, the DRAM controller 130 may output a clock enable signal CKE to be provided to the DRAM devices 110.

The clock enable signal CKE may be used to control operations of each of the DRAM devices 110. When the clock enable signal CKE has a first logic level (e.g., logical high), each of the DRAM devices 110 may operate in a "normal mode". In the normal mode, each of the DRAM devices 110 may receive or output data in synchronization with a clock signal according to a control of the DRAM controller 130.

On the other hand, when the clock enable signal CKE has a second logic level (e.g., logical low), the clock signal provided to each of the DRAM devices 110 may be ignored. Accordingly, commands provided from the DRAM controller 130 may not be interpreted by each of the DRAM devices 110. Furthermore, when the clock enable signal CKE has the second logic level, each of the DRAM devices 110 may operate in a "self-refresh mode". In the self-refresh mode, each of the DRAM devices 110 may perform a refresh operation to retain stored data.

In an exemplary embodiment, the DRAM controller 130 may control a selection signal SEL. The selection signal SEL may be used to select a "target DRAM device" from each one of the one or more DRAM groups. The target DRAM device may be a DRAM device that operates in the normal mode in response to the clock enable signal CKE.

For instance, in an exemplary embodiment illustrated in FIG. 1, the selection signal SEL may be used to select one target DRAM device that operates in the normal mode in response to the clock enable signal CKE, from the first DRAM group G1. One of the first DRAM device 111 and the second DRAM device 112 may be selected as the target DRAM device. Furthermore, the selection signal SEL may be used to select one target DRAM device that operates in the normal mode in response to the clock enable signal, from the second DRAM group G2. One of the third DRAM device 113 and the fourth DRAM device 114 may be selected as the target DRAM device.

In an exemplary embodiment, one or more "stand-by DRAM devices" may operate in the self-refresh mode. The stand-by DRAM devices may be DRAM devices other than one or more target DRAM devices selected from the one or more DRAM groups. For instance, in an exemplary embodiment illustrated in FIG. 1, when the first DRAM device 111 is selected as the target DRAM device and operates in the normal mode, the second DRAM device may operate in the self-refresh mode as the stand-by DRAM device. Furthermore, when the third DRAM device 113 is selected as the target DRAM device and operates in the normal mode, the fourth DRAM device may operate in the self-refresh mode as the stand-by DRAM device. However, the present disclosure is not limited thereto. A DRAM device selected as the target DRAM device or the stand-by DRAM device may be variously changed or modified.

To sum up, in an exemplary embodiment, one of DRAM devices included in one DRAM group may be selected as the target DRAM device and may operate in the normal mode. Furthermore, each of one or more DRAM devices other than the target DRAM device may operate in the self-refresh mode as the stand-by DRAM device.

The selection signal SEL may be variously implemented according to a design of the memory system 100. In some exemplary embodiments, the selection signal SEL may be output directly from the DRAM controller 130. For instance, the selection signal SEL may include at least one of general-purpose input/output (GPIO) signals from among signals output from the DRAM controller 130. The GPIO signals include remaining signals other than signals used for interfacing between the DRAM devices 110 and the DRAM controller 130. For instance, the selection signal SEL may be implemented with one or more of "reserved" signals.

In some other exemplary embodiments, the selection signal SEL may be controlled directly or indirectly by the DRAM controller 130. For instance, the memory system 100 may include firmware to drive components included therein. The DRAM controller 130 may output a control signal, and the firmware may generate the selection signal SEL by processing the control signal. That is, the DRAM controller 130 may control the selection signal SEL directly or indirectly through the firmware.

However, the above-described exemplary embodiments are provided to help understanding of the present disclosure. The selection signal SEL may be implemented differently from that of the above-described exemplary embodiments.

The selection circuit 150 may include, for instance, one or more selectors. In FIG. 1, the selection circuit 150 may include a first selector S1 and a second selector S2. FIG. 1 illustrates that the selection circuit 150 includes two selectors S1 and S2, but the present disclosure is not limited to a configuration illustrated in FIG. 1. The number of selectors included in the selection circuit 150 may be variously changed or modified. In some exemplary embodiments, the number of selectors included in the selection circuit 150 may be equal to the number of DRAM groups included in the DRAM devices 110. The reason is why one selector is configured to select one target DRAM device in one DRAM group.

Furthermore, FIG. 1 illustrates that the selection circuit 150 includes sub components (i.e., selectors), but the present disclosure is not limited to the configuration illustrated in FIG. 1. The selection circuit 150 may be implemented in a single circuit and may be configured to perform its own function which will be described later. A configuration illustrated in FIG. 1 is an example to help understanding of the present disclosure.

The selection circuit 150 may receive the clock enable signal CKE from the DRAM controller 130. In an exemplary embodiment, the selection circuit 150 may provide the clock enable signal CKE to the plurality of DRAM devices 110 in response to the selection signal SEL. More particularly, the selection circuit 150 may provide the clock enable signal CKE to one or more target DRAM devices respectively selected from one or more DRAM groups in response to the selection signal SEL. On the other hand, the selection circuit 150 may not provide the clock enable signal CKE to one or more stand-by DRAM devices other than the one or more target DRAM devices from among the DRAM devices 110.

For instance, when a logic level of the selection signal SEL is logical low, the first selector S1 may provide the clock enable signal CKE to the first DRAM device 111, and the second selector S2 may provide the clock enable signal CKE to the third DRAM device 113. Herein, the second DRAM device 112 and the fourth DRAM device 114 may operate in the self-refresh mode without the clock enable signal CKE. On the other hand, when a logic level of the selection signal SEL is logical high, the first selector S1 may provide the clock enable signal CKE to the second DRAM device 112, and the second selector S2 may provide the clock enable signal CKE to the fourth DRAM device 114. Herein, the first DRAM device 111 and the third DRAM device 113 may operate in the self-refresh mode without the clock enable signal CKE.

However, the present disclosure is not limited to the above-described instance. Logic levels of the selection signal SEL for selecting a target DRAM device may be changed or modified. Furthermore, when the number of DRAM devices included in one DRAM group increases, the selection signal SEL may be configured to include a plurality of bits. For instance, in the case where one DRAM group includes four DRAM devices, the selection signal SEL may be formed of two bits to select one target DRAM device.

That is, an exemplary embodiment of the present disclosure may be variously changed or modified.

In an exemplary embodiment illustrated in FIG. 1, for instance, when the first DRAM device 111 of the first DRAM group G1 and the third DRAM device 113 of the second DRAM group G2 are selected as target DRAM devices, the selection circuit 150 may provide the clock enable signal CKE to the first DRAM device 111 and the third DRAM device 113. For instance, the first selector S1 may provide the clock enable signal CKE to the first DRAM device in response to the selection signal SEL, and the second selector S2 may provide the clock enable signal CKE to the third DRAM device 113 in response to the selection signal SEL. Accordingly, the first DRAM device 111 and the third DRAM device 113 may operate in the normal mode as target DRAM devices in response to the clock enable signal CKE.

In the above-described exemplary embodiment, on the other hand, the selection circuit 150 may not provide the clock enable signal CKE to the second DRAM device 112 and the fourth DRAM device 114. The second DRAM device 112 and the fourth DRAM device 114 may operate in the self-refresh mode as stand-by DRAM devices. Operations of the plurality of DRAM devices 110 will be more fully described with reference to FIG. 2.

However, as described above, when the clock enable signal CKE is not provided to stand-by DRAM devices, nodes of the stand-by DRAM devices that are configured to receive the clock enable signal CKE may be floated, thereby causing unstable operations of the stand-by DRAM devices. A stabilization circuit may be used to stabilize operations of the stand-by DRAM devices. The stabilization circuit will be more fully described with reference to FIGS. 3 and 4.

For instance, the selectors S1 and S2 included in the selection circuit 150 may include de-multiplexers that operate in response to the selection signal SEL. However, the present disclosure is not limited thereto. The selection circuit 150 may be implemented with various circuit components, such as a switch circuit, a gate circuit, and the like, to provide the clock enable signal CKE to one or more target DRAM devices.

In some cases, conversion of operation modes of the plurality of DRAM devices 110 may be required. As an exemplary embodiment, when available storage capacities of one or more target DRAM devices are insufficient, the conversion of the operation modes may be required. As another exemplary embodiment, when an access to at least one of one or more stand-by DRAM devices is requested, the conversion of the operation modes may be required. When the operating modes are converted, one or more target DRAM devices that have operated in the normal mode may operate in the self-refresh mode, and one or more stand-by DRAM devices that have operated in the self-refresh mode may operate in the normal mode. The conversion of the operation modes will be more fully described with reference to FIGS. 5 and 6.

Figure 2:
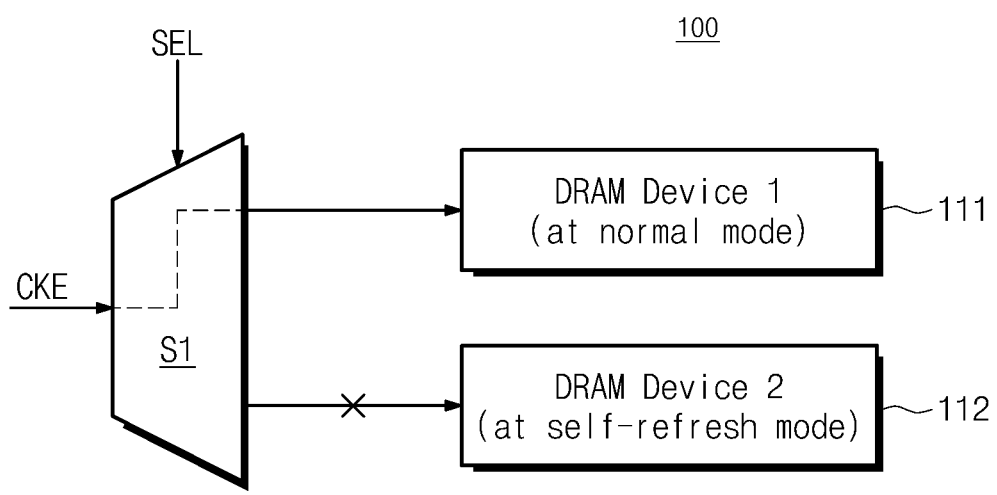
FIG. 2 is a conceptual diagram for further describing an operation of a memory system illustrated in FIG. 1.

FIG. 2 is a conceptual diagram for further describing an operation of a memory system illustrated in FIG. 1. In FIG. 2, a first selector S1, a first DRAM device 111, and a second DRAM device 112 included in a memory system 100 are illustrated. However, the memory system 100 may further include other components not illustrated in FIG. 2. Furthermore, as described above, the number of DRAM devices may be variously changed or modified. A configuration illustrated in FIG. 2 is provided to help understanding of the present disclosure, not to limit the present disclosure.

The first selector S1 may receive a clock enable signal CKE from a DRAM controller 130 (refer to FIG. 1). The first selector S1 may receive a selection signal SEL that is controlled by the DRAM controller 130. The first selector S1 may provide the clock enable signal CKE to one of the first DRAM device 111 and the second DRAM device 112 included in a first DRAM group G1 (refer to FIG. 1) in response to the selection signal SEL.

One of the first DRAM device 111 and the second DRAM device 112 may be selected as a target DRAM device, based on the selection signal SEL. The selected target DRAM device may receive the clock enable signal CKE through the first selector S1, and may operate in the normal mode in response to the clock enable signal CKE. On the other hand, a stand-by DRAM device other than the target DRAM device may operate in a self-refresh mode without the clock enable signal CKE.

For instance, when a logic level of the selection signal SEL is logical low, the first DRAM device 111 may be selected as the target DRAM device as illustrated in FIG. 2. The first selector S1 may provide the clock enable signal CKE to the first DRAM device 111. The first DRAM device 111 may operate in the normal mode in response to the clock enable signal CKE. The second DRAM device 112 may operate in the self-refresh mode as the stand-by DRAM device without the clock enable signal CKE. That is, to sum up, the clock enable signal CKE may be provided to one of DRAM devices included in one DRAM group, based on the selection signal SEL.

On the other hand, when a logic level of the selection signal SEL is logical high, unlike FIG. 2, the second DRAM device 112 may be selected as the target DRAM device. The first selector S1 may provide the clock enable signal CKE to the second DRAM device 112. The second DRAM device 112 may operate in the normal mode in response to the clock enable signal CKE. The first DRAM device 111 may operate in the self-refresh mode as the stand-by DRAM device without the clock enable signal CKE. Whether a DRAM device is a target DRAM device or a stand-by DRAM device may be determined relatively based on the selection signal SEL.

However, the present disclosure is not limited to the above instance. Logic levels of the selection signal for selecting the first DRAM device 111 or the second DRAM device as the target DRAM device may be interchangeable. For example, the logic levels of the signals may be inverted. The above-described instance is provided to help understanding of the present disclosure.

A second selector S2 (refer to FIG. 1) included in the selection circuit 150 and third and fourth DRAM devices 113 and 114 (refer to FIG. 1) included in a second DRAM group G2 (refer to FIG. 1) may operate similarly to the above descriptions, and redundant descriptions will be omitted for brevity of the description.

In the case where one DRAM group includes three or more DRAM devices, the DRAM devices and the selection circuit configured to provide the clock enable signal CKE to the DRAM devices may operate similarly to the above descriptions. One of three or more DRAM devices may be selected as the target DRAM device based on the selection signal, and may operate in the normal mode in response to the clock enable signal CKE. On the other hand, remaining DRAM devices of the three or more DRAM devices other than the target DRAM device may operate as stand-by DRAM devices in the self-refresh mode without the clock enable signal CKE.

According to an exemplary embodiment described with reference to FIGS. 1 and 2, the memory system 100 may be implemented to have a buffering capacity larger than that is able to be recognized or supported by the DRAM controller 130. For instance, even though the DRAM controller 130 is configured to support just two DRAM devices (e.g., the first DRAM device 111 and the third DRAM device 113), additional DRAM devices (e.g., the second DRAM device 112 and the fourth DRAM device 114) may be further supported by using the selection signal SEL and the selection circuit 150 according to an exemplary embodiment.

In some cases, it may be possible to secure a storage capacity larger than that is able to be recognized or supported by the DRAM controller 130, by making additional DRAM devices operate in the normal mode. In particular, an effect according to an exemplary embodiment may be obtained by implementing the selection circuit 150 without redesigning the DRAM controller 130. Accordingly, time and cost required to redesign the DRAM controller 130 may not be consumed.

Figure 3:
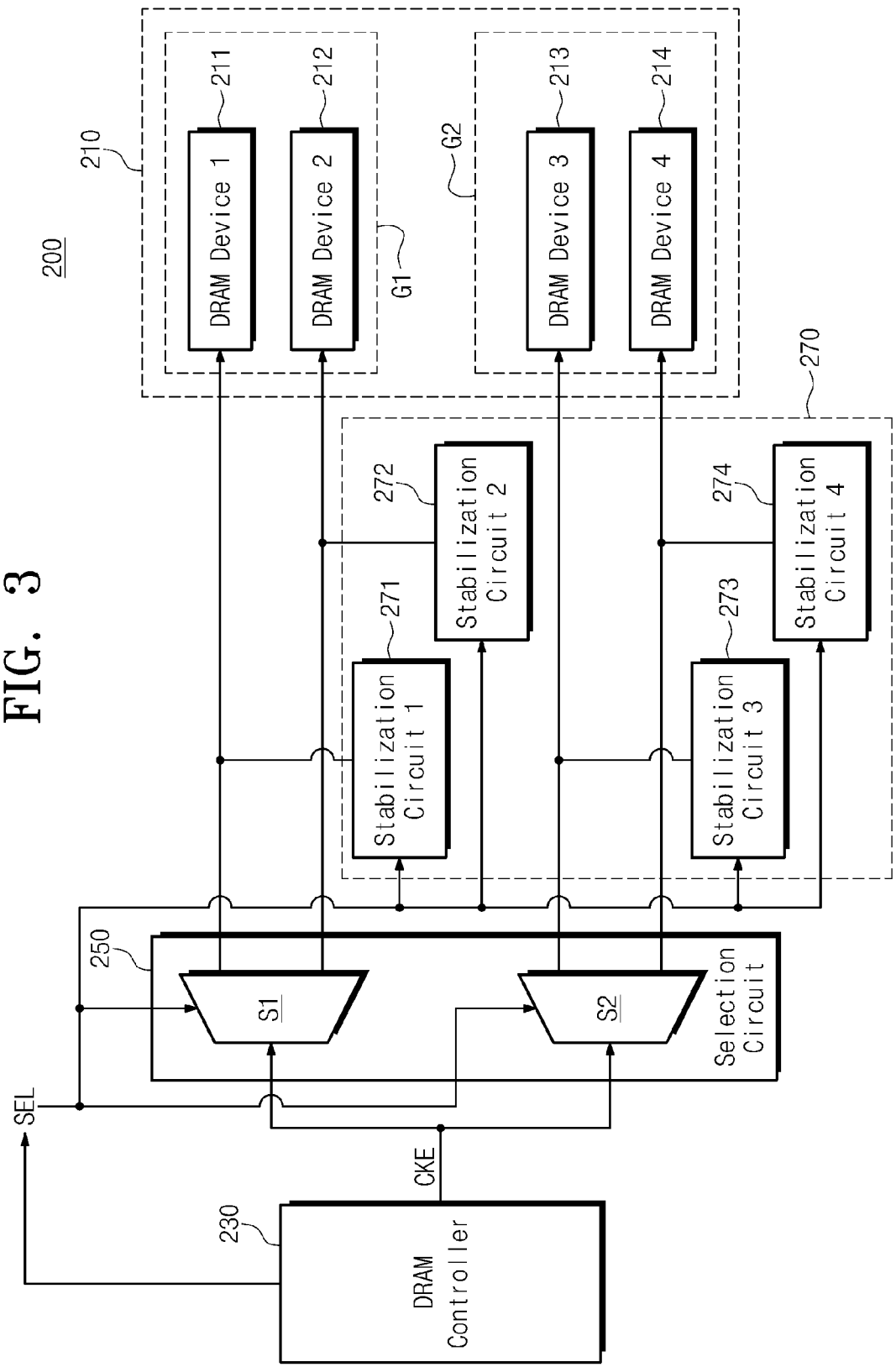
FIG. 3 is a block diagram illustrating a memory system according to an exemplary embodiment.

FIG. 3 is a block diagram illustrating a memory system according to an exemplary embodiment. A memory system 200 may include a plurality of DRAM devices 210, a DRAM controller 230, a selection circuit 250, and a plurality of stabilization circuits 270. The memory system 200 may be used as a working memory, a buffer memory, or an operation memory of a computing device or an electronic system.

A first DRAM group G1 and a second DRAM group G2 included in the plurality of DRAM devices 210 may correspond to a first DRAM group G1 and a second DRAM group G2 included in a plurality of DRAM devices 110 illustrated in FIG. 1. Furthermore, configurations and functions of the first to fourth DRAM devices 211 to 214 may include those of first to fourth DRAM devices 111 to 114 illustrated in FIG. 1. Redundant descriptions associated with the plurality of DRAM devices 210 will be omitted below for brevity of the description.

Configurations and functions of the DRAM controller 230 and the selection circuit 250 may include those of a DRAM controller 130 and a selection circuit 150 illustrated in FIG. 1. Redundant descriptions associated with the DRAM controller 230 and the selection circuit 250 will be omitted below for brevity of the description.

The plurality of stabilization circuits 270 may include, for instance, a first stabilization circuit 271 to a fourth stabilization circuit 274. The plurality of stabilization circuits 270 may provide a "self-refresh signal" to the plurality of DRAM devices 210. The self-refresh signal may have the same level as a second logic level (e.g., logical low) of a clock enable signal CKE used in an operation of a self-refresh mode.

As described above, one or more DRAM devices may operate in a normal mode in response to the clock enable signal CKE. More particularly, one or more target DRAM devices may operate in the normal mode in response to a first logic level (e.g., logical low) of the clock enable signal CKE.

On the other hand, as described above, the clock enable signal CKE may not be provided to one or more stand-by DRAM devices. Accordingly, nodes of the stand-by DRAM devices configured to receive the clock enable signal CKE may be floated, thereby causing unstable operations of the stand-by DRAM devices.

In an exemplary embodiment, the plurality of stabilization circuits 270 may provide the self-refresh signal to the one or more stand-by DRAM devices. As described above, the self-refresh signal may have the same level as the second logic level of the clock enable signal CKE. Thus, when the one or more stand-by DRAM devices receive the self-refresh signal, the one or more stand-by DRAM devices may stably operate in the self-refresh mode in response to the self-refresh signal, without the clock enable signal CKE.

The first to fourth stabilization circuits 271 to 274 may be configured to provide the self-refresh signals to the first to fourth DRAM devices 211 to 214, respectively. As an exemplary embodiment, the plurality of stabilization circuits 270 may provide the self-refresh signal to the one or more stand-by DRAM devices in response to the selection signal SEL. The plurality of stabilization circuits 270 may provide the self-refresh signal to a DRAM device operating in the self-refresh mode, but may not provide the self-refresh signal to a DRAM device operating in the normal mode.

For instance, when the first DRAM device 211 is selected as the target DRAM device and the second DRAM device 212 operates in the self-refresh mode in response to the selection signal SEL having a logical low level, the first stabilization circuit 271 may not operate and the second stabilization circuit 272 may provide the self-refresh signal to the second DRAM device 212. For instance, when the third DRAM device 213 operates in the self-refresh mode and the fourth DRAM device 214 is selected as the target DRAM device in response to the selection signal SEL having a logical high level, the third stabilization circuit 273 may provide the self-refresh signal to the third DRAM device 213 and the fourth stabilization circuit 274 may not operate.

However, the above instances are provided to help understanding of the present disclosure. A configuration of the plurality of stabilization circuits 270 may be variously changed or modified. The present disclosure is not limited to descriptions associated with FIG. 3 and a configuration illustrated in FIG. 3. A configuration of the plurality of stabilization circuits 270 will be more fully described with reference to FIG. 4.

Figure 4:
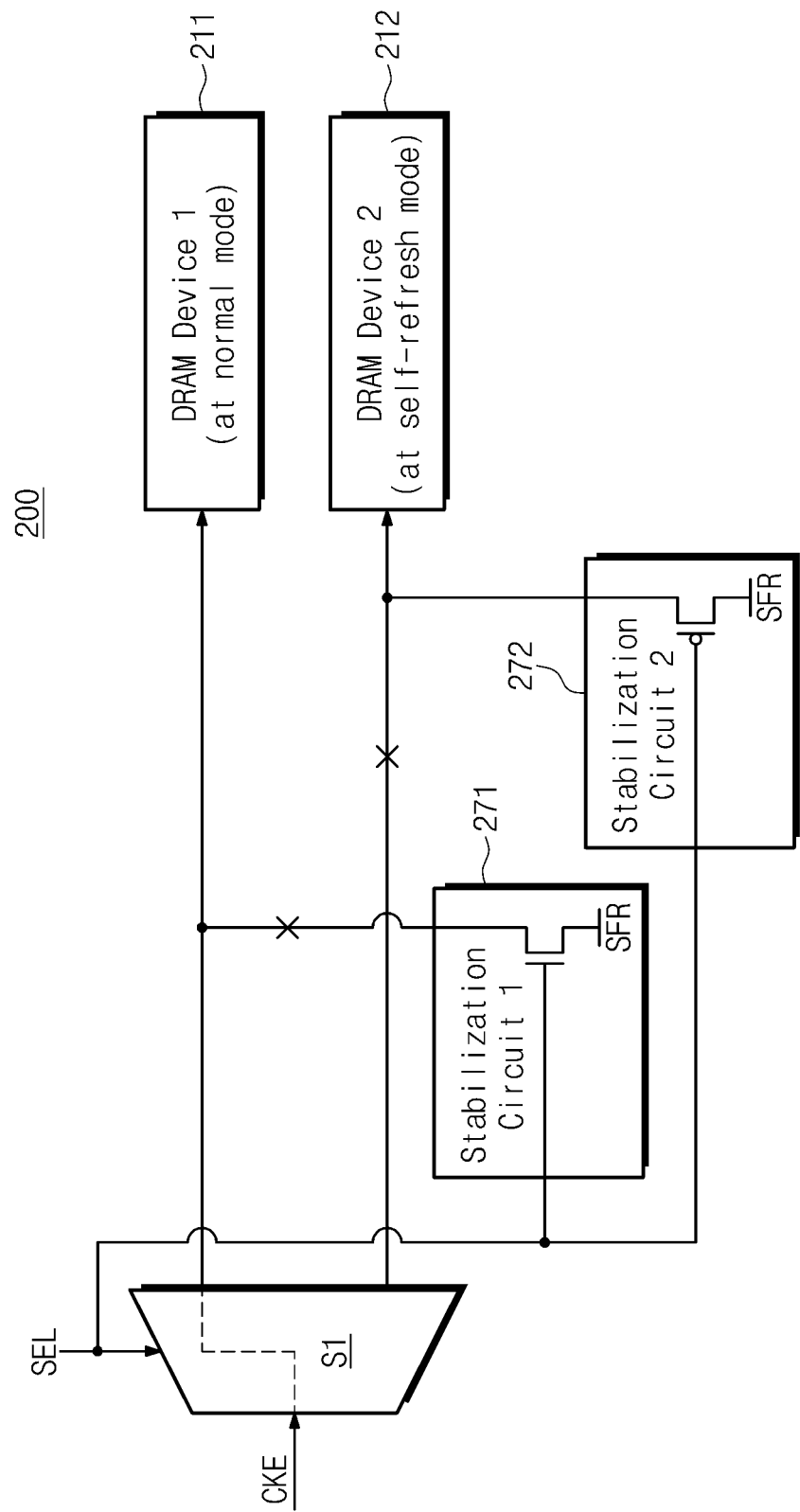
FIG. 4 is a conceptual diagram for describing an operation of a memory system illustrated in FIG. 3.

FIG. 4 is a conceptual diagram for describing an operation of a memory system illustrated in FIG. 3. In FIG. 4, a first selector S1, a first DRAM 211, a second DRAM 212, a first stabilization circuit 271, and a second stabilization circuit 272 included in a memory system 200 are just illustrated. However, the memory system 200 may further include components not illustrated in FIG. 4. Furthermore, as described above, the number of DRAM devices may be variously changed or modified. A configuration illustrated in FIG. 4 is provided to help understanding of the present disclosure.

As an exemplary embodiment, the first stabilization circuit 271 may include an n-channel metal oxide semiconductor (NMOS) transistor, and a second stabilization circuit 272 may include a p-channel MOS (PMOS) transistor. The first stabilization circuit 271 may provide a self-refresh signal SFR to a first DRAM device 211 in response to a selection signal SEL having a logical high level. The second stabilization circuit 272 may provide the self-refresh signal SFR to a second DRAM device 212 in response to the selection signal SEL having a logical low level.

For instance, when a logic level of the selection signal SEL is logical low, as illustrated in FIG. 4, the first DRAM device 211 may be selected as a target DRAM device. The first selector S1 may provide a clock enable signal CKE to the first DRAM device 211. The first DRAM device 211 may operate in a normal mode in response to the clock enable signal CKE. In this instance, the first stabilization circuit 271 may not operate because the logic level of the selection signal SEL is logical low.

Furthermore, in the above-described instance, the second DRAM device 212 may operate in a self-refresh mode without the clock enable signal CKE. When the logic level of the selection signal SEL is logical low, the second stabilization circuit 272 may provide the self-refresh signal SFR to the second DRAM device 212 in response to the selection signal SEL. As described above, the self-refresh signal SFR may have the same level as a second logic level (e.g., logical low) of the clock enable signal CKE used in an operation of the self-refresh mode. Accordingly, the second DRAM device 212 may operate in the self-refresh mode stably in response to the self-refresh signal SFR instead of the clock enable signal CKE.

On the other hand, when the logic level of the selection signal SEL is logical high, unlike FIG. 4, the second DRAM device 212 may be selected as a target DRAM device. The first selector S1 may provide the clock enable signal CKE to the second DRAM device 212. The second DRAM device 212 may operate in the normal mode in response to the clock enable signal CKE. The second stabilization circuit 272 may not operate because the logic level of the selection signal SEL is logical high.

Furthermore, the first DRAM device 211 may operate in the self-refresh mode as a stand-by DRAM device without the clock enable signal CKE. When the logic level of the selection signal SEL is logical high, the first stabilization circuit 271 may provide the self-refresh signal SFR to the first DRAM device 211 in response to the selection signal SEL. Accordingly, the first DRAM device 211 may operate in the self-refresh mode stably in response to the self-refresh signal SFR instead of the clock enable signal CKE.

However, the present disclosure is not limited to the above instance. The logic levels of the selection signal SEL for selecting the first DRAM device 211 or the second DRAM device 212 as the target DRAM device may be interchangeable. Furthermore, operations of the first and second stabilization circuits 271 and 272 may be variously changed or modified according to designs of the memory system 200 and the selection signal SEL. The above examples are provided to help understanding of the present disclosure.

Configurations of the first and second stabilization circuits 271 and 272 may be changed or modified differently from those illustrated in FIG. 4. For instance, the first stabilization circuit 271 and the second stabilization circuit 272 may be implemented with various circuits, such as transistors, gate circuits, switch circuits, level shifters, and the like, to provide the self-refresh signal SFR to the first DRAM device 211 and the second DRAM 212, respectively. FIG. 4 illustrates an example to help understanding of the present disclosure, not to limit the present disclosure.

A second selector S2 (refer to FIG. 3), a third DRAM device 213 (refer to FIG. 3), a fourth DRAM device 214 (refer to FIG. 3), a third stabilization circuit 273, and a fourth stabilization circuit 274 may operate similarly to the above descriptions. Redundant descriptions will be omitted below for brevity of the description.

A stabilization circuit according to an exemplary embodiment has been described with reference to FIGS. 3 and 4. However, the stabilization circuit is an example component that can be used to implement a memory system according to an exemplary embodiment. For instance, without a separate stabilization circuit, a selection circuit 150 or 250 may be configured to provide the clock enable signal CKE to a target DRAM device and to provide the self-refresh signal to a stand-by DRAM device in response to the selection signal SEL. That is, an exemplary embodiment may be variously changed or modified.

Figure 5:
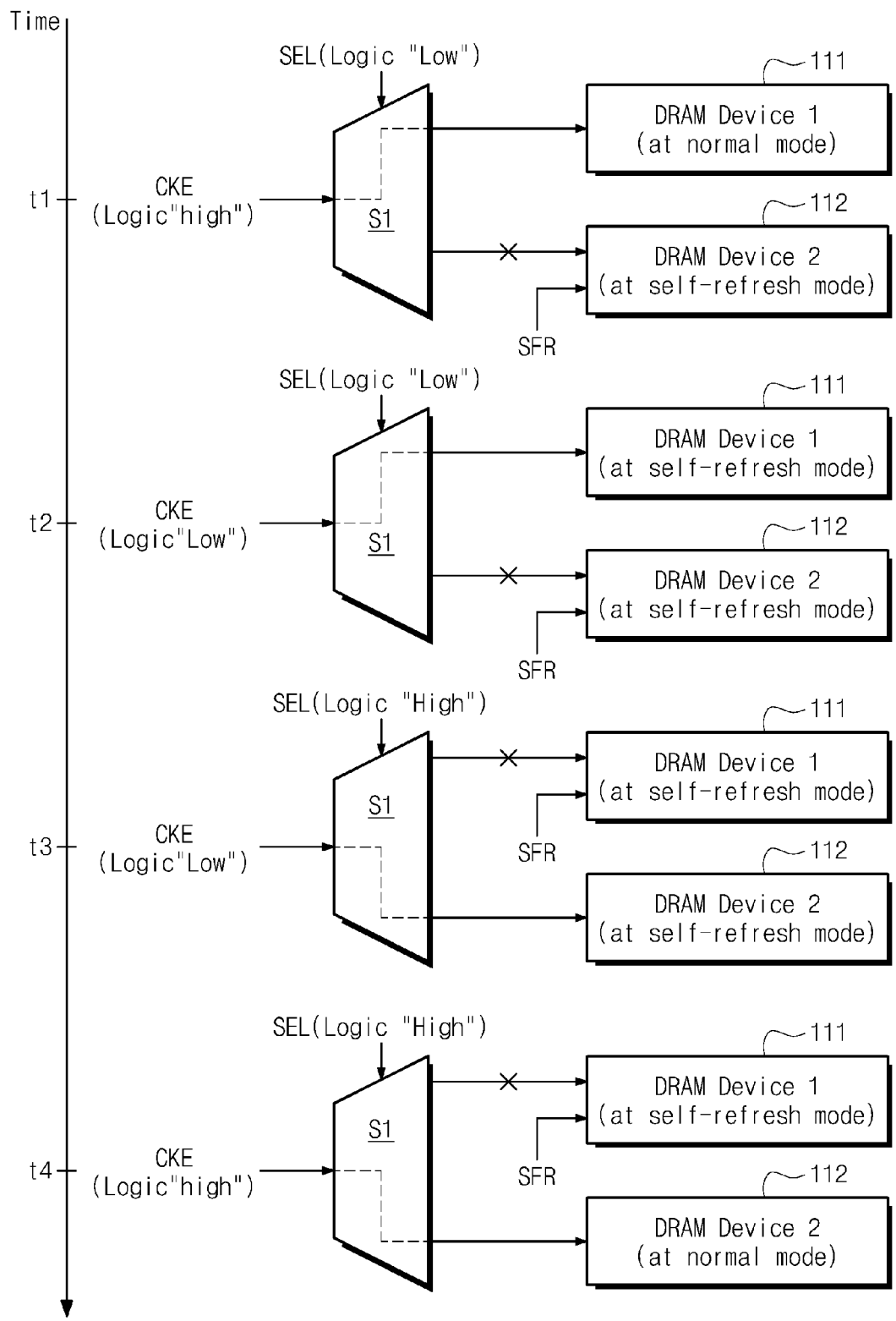
FIG. 5 is a conceptual diagram for describing conversion of operation modes of DRAM devices included in a memory system illustrated in FIG. 1.
Figure 6:
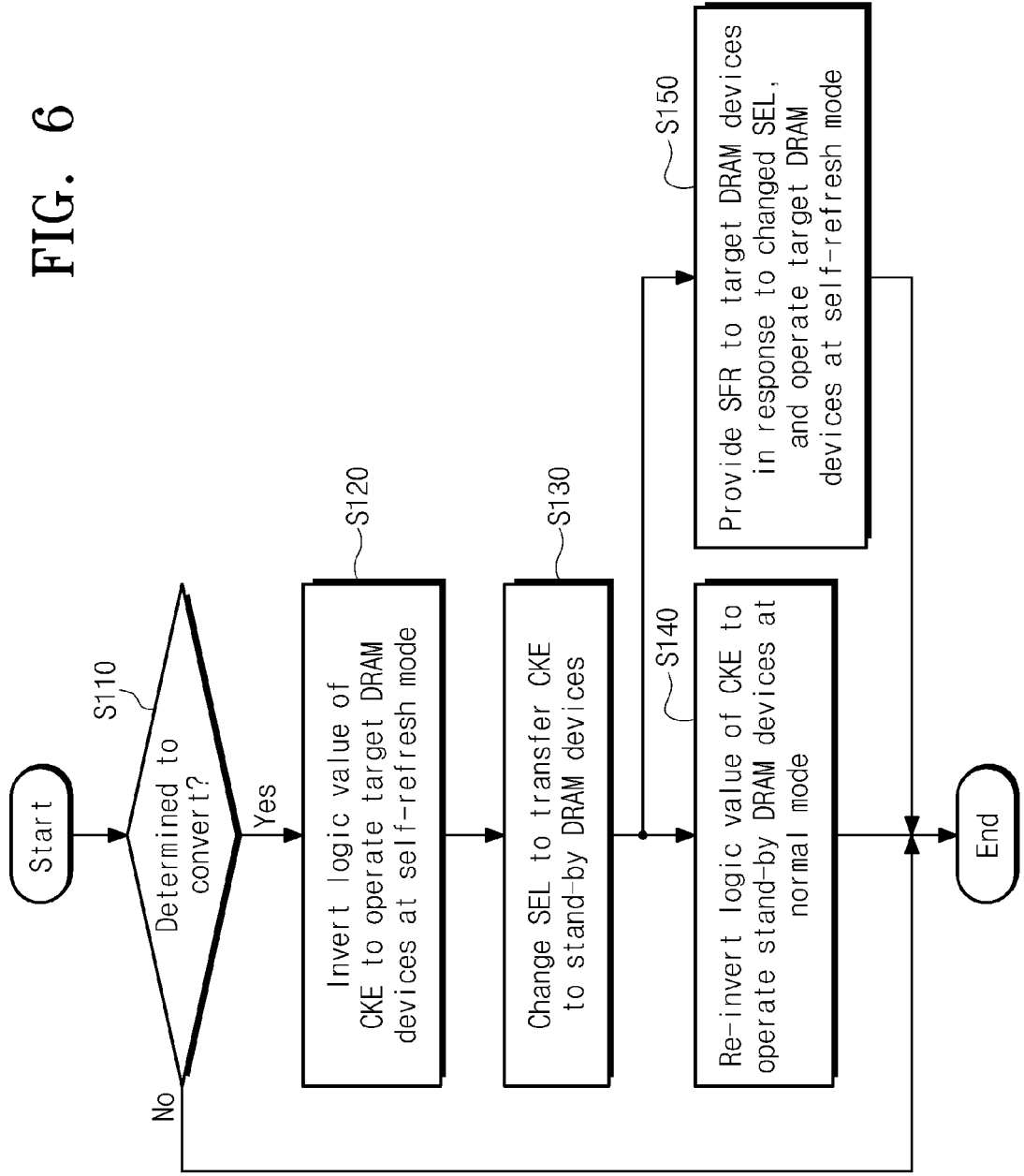
FIG. 6 is a flow chart describing conversion of operation modes of DRAM devices included in a memory system illustrated in FIG. 1.

FIG. 5 is a conceptual diagram for describing conversion of operation modes of DRAM devices included in a memory system illustrated in FIG. 1. FIG. 6 is a flow chart describing conversion of operation modes of DRAM devices included in a memory system illustrated in FIG. 1. FIGS. 5 and 6 will be referred together to describe the conversion of the operation modes.

At time "t1", a selection signal SEL may have a logic level of logical low. For instance, based on a selection signal SEL, a first DRAM device 111 may operate as a target DRAM device and a second DRAM device 112 may operate a stand-by DRAM device. A first selector S1 may provide a clock enable signal CKE having a logic level of logical high to the first DRAM device 111. The first DRAM device 111 may operate in a normal mode in response to the clock enable signal CKE. The second DRAM device 122 may operate in a self-refresh mode without the clock enable signal CKE. When a stabilization circuit described with reference to FIGS. 3 and 4 is employed, a self-refresh signal SFR (refer to FIG. 4) may be provided to the second DRAM device 122.

Operation S110 may be performed between time "t1" and time "t2". In operation S110, it may be determined whether the conversion of the operation modes is required in a plurality of DRAM devices 110 (refer to FIG. 1). For instance, a DRAM controller 130 (refer to FIG. 1) may monitor operations of the plurality of DRAM devices 110 and accesses to the plurality of DRAM devices 110. The DRAM controller 130 may determine whether the operation modes need to be converted based on the monitoring result.

As described above, in some cases, the conversion of the operation modes of the plurality of DRAM devices 110 may be required. That is, it may be necessary to interchange the operation modes of one or more target DRAM devices and the operation modes of one or more stand-by DRAM devices. As an exemplary embodiment, when an available storage capacity of the one or more target DRAM devices is insufficient, the conversion of the operation modes may be required. As another exemplary embodiment, the conversion of the operation modes may be required when an access to at least one of the one or more stand-by DRAM devices is requested. However, the present disclosure is not limited to these exemplary embodiments. Other cases requiring the conversion of the operation modes may further exist.

As an exemplary embodiment, in the case where an available storage capacity of the one or more target DRAM devices is insufficient or in the case where an access to at least one of the one or more stand-by DRAM devices is requested, the DRAM controller 130 may determine to convert the operation modes of the one or more target DRAM devices and the one or more stand-by DRAM devices. That is, according to the determination of the DRAM controller 130, the one or more stand-by DRAM devices may operate in a normal mode, and the one or more target DRAM devices may operate in a self-refresh mode. Operation S120 may be performed at time "t2" when the DRAM controller 130 determines to convert the operation modes.

In operation S120, a logic level of the clock enable signal CKE may be inverted according to a control of the DRAM controller 130. At time "t2", the selection signal SEL may still have a logic level of logical low. Accordingly, the clock enable signal CKE may still be provided to the first DRAM device 111. Thus, the first DRAM device 111 selected as a target DRAM device may operate in a self-refresh mode.

Furthermore, a self-refresh signal SFR may be provided to the second DRAM device 112 that still operates as a stand-by DRAM device.

Afterwards, operation S130 may be performed at time "t3". In operation S130, the selection signal SEL may be changed according to a control of the DRAM controller 130. For instance, a logic level of the selection signal SEL may be changed from logical low to logical high. According to this, a first selector S1 may provide the clock enable signal CKE to the second DRAM device 112 that has operated as the stand-by DRAM device. Since the clock enable signal CKE has a logic level of logical low, the second DRAM device 112 may still operate in the self-refresh mode.

Afterwards, operation S140 may be performed at time "t4". In operation S140, the logic level of the clock enable signal CKE may be re-inverted according to a control of the DRAM controller 130. Accordingly, the clock enable signal CKE having a logic level of logical high may be provided to the second DRAM device 112. Thus, the second DRAM device 112 may operate in the normal mode.

In operation S150, the self-refresh signal SFR may be provided to the first DRAM device in response to changing the selection signal SEL (refer to time "t3" and time "t4"). Accordingly, the first DRAM device 111 may operate in the self-refresh mode stably in response to the self-refresh signal SFR.

To sum up, in the case where operation modes are converted, one or more target DRAM devices (e.g., the first DRAM device 111) that have operated in the normal mode may operate in the self-refresh mode in response to the self-refresh signal SFR. Furthermore, some of one or more stand-by DRAM devices (e.g., the second DRAM device 112) that have operated in the self-refresh mode may operate in the normal mode in response to the clock enable signal CKE.

However, the present disclosure is not limited to the above exemplary embodiment. Logic levels of the selection signal SEL for respectively selecting the first DRAM device 111 and the second DRAM device as a target DRAM device may be interchangeable. The above-described exemplary embodiment is provided to help understanding of the present disclosure. Furthermore, a second selector S2 (refer to FIG. 1), a third DRAM device 113 (refer to FIG. 1), and a fourth DRAM device 114 (refer to FIG. 1) may operate similarly to the above descriptions. Redundant descriptions will be omitted below for brevity of the description.

Figure 7:
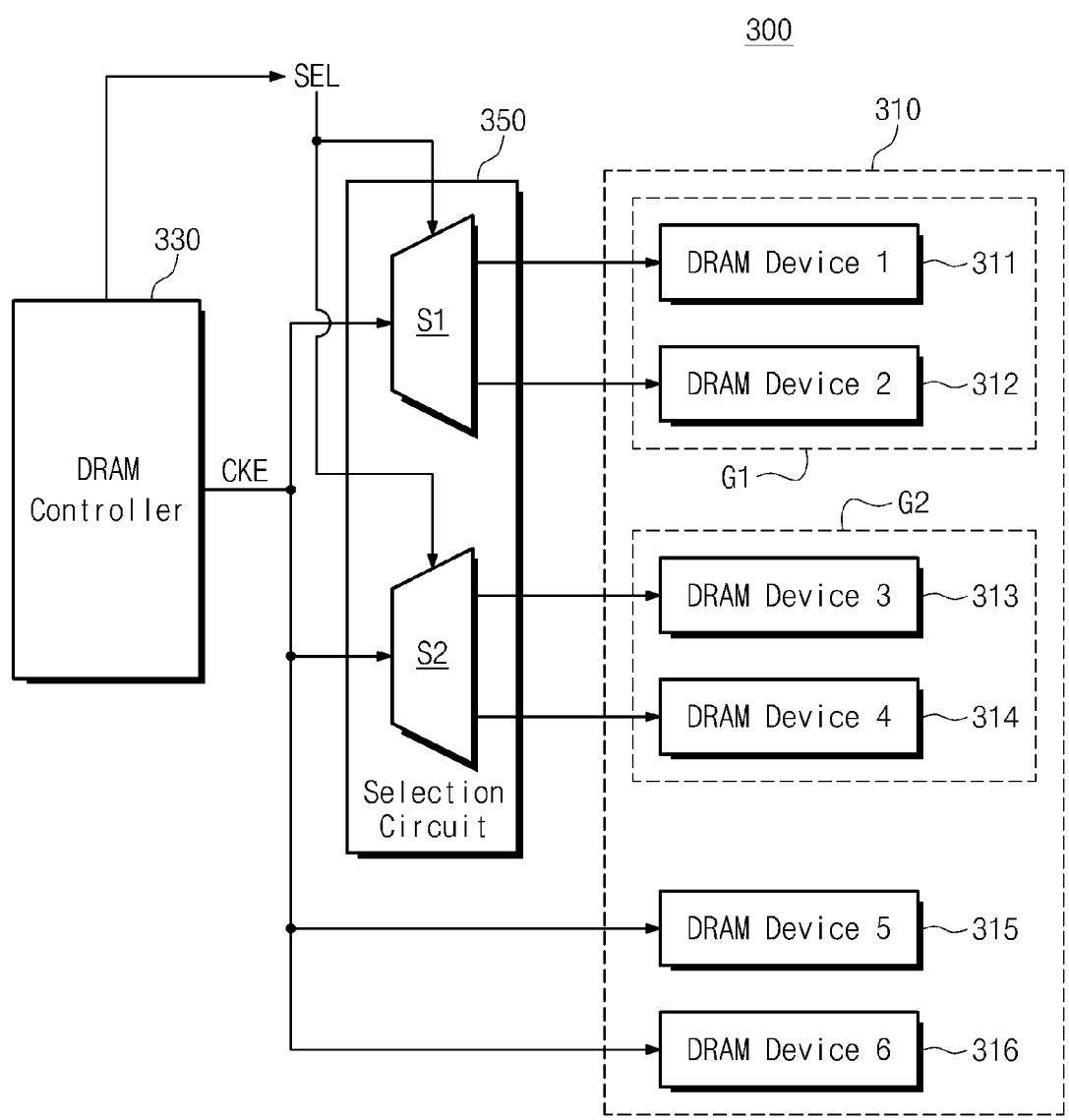
FIG. 7 is a block diagram illustrating a memory system according to an exemplary embodiment.
Figure 8:
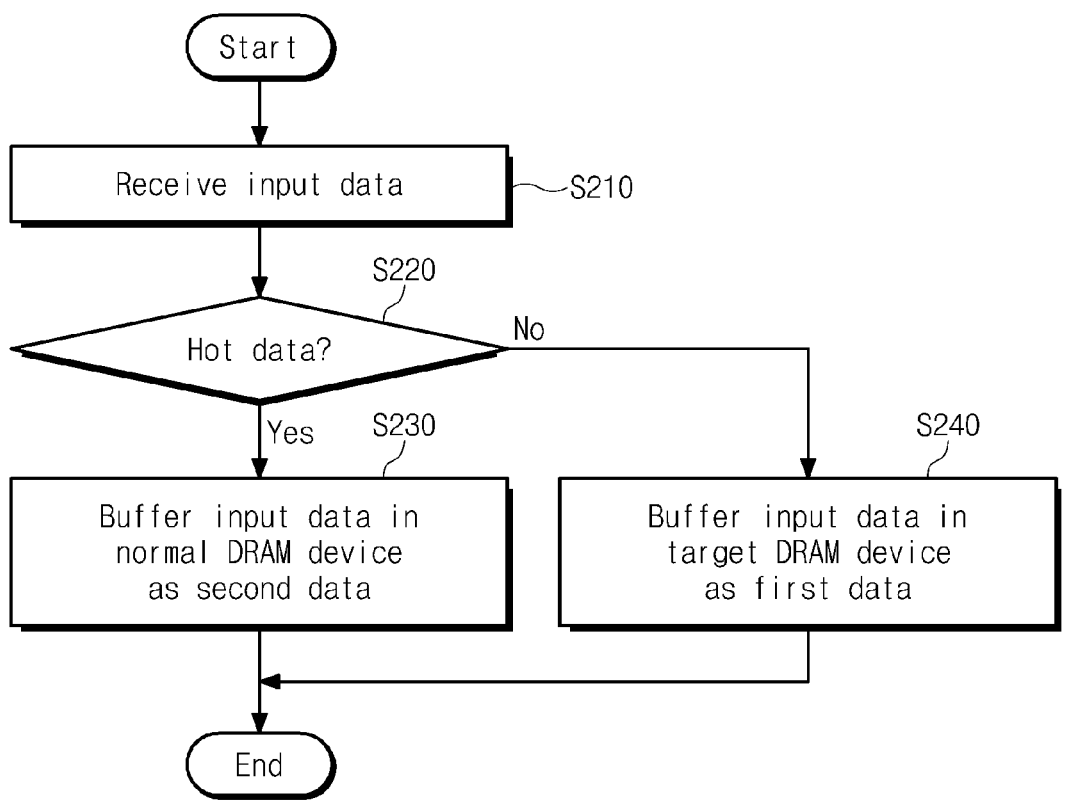
FIG. 8 is a flow chart describing an operation of a memory system illustrated in FIG. 7.

FIG. 7 is a block diagram illustrating a memory system according to an exemplary embodiment. FIG. 8 is a flow chart describing an operation of a memory system illustrated in FIG. 7. FIGS. 7 and 8 will be referred together to describe a configuration and an operation of a memory system 300.

The memory system 300 may include a plurality of DRAM devices 310, a DRAM controller 330, and a selection circuit 350. The memory system 300 may be used as a working memory, a buffer memory, or an operation memory of a computing device or an electronic system.

Configurations and functions of the DRAM controller 330 and the selection circuit 350 may include those of a DRAM controller 130 and a selection circuit 150 illustrated in FIG. 1, respectively. Redundant descriptions associated with the DRAM controller 330 and the selection circuit 350 will be omitted below for brevity of the description.

A first DRAM group G1 and a second DRAM group G2 included in the plurality of DRAM devices 310 may correspond to a first DRAM group G1 and a second DRAM group G2 included in a plurality of DRAM devices 110 illustrated in FIG. 1. Furthermore, configurations and functions of the first to fourth DRAM devices 311 to 314 may include those of first to fourth DRAM devices 111 to 114 illustrated in FIG. 1. Redundant descriptions associated with the first to fourth DRAM devices 311 to 314 will be omitted below for brevity of the description.

As an exemplary embodiment, the plurality of DRAM devices 310 may further include one or more "general DRAM devices". The general DRAM device may not be included in the plurality of DRAM devices 310. In FIG. 7, for instance, a fifth DRAM device 315 and a sixth DRAM device 316 may be illustrated as being the general DRAM devices included in the plurality of DRAM devices 310. The fifth DRAM device 315 and the sixth DRAM device 316 may not be included in the first DRAM group G1 or the second DRAM group G2.

The general DRAM devices may operate regardless of a selection signal SEL. For instance, the general DRAM devices may receive a clock enable signal CKE regardless of the selection signal SEL. The general DRAM devices may operate in a normal mode in response to the clock enable signal CKE regardless of the selection signal SEL.

For instance, the fifth DRAM device 315 and the sixth DRAM device 316 may operate regardless of the selection signal SEL. The fifth DRAM device 315 and the sixth DRAM device 316 may receive the clock enable signal CKE regardless of the selection signal SEL. In this case, the fifth DRAM device 315 and the sixth DRAM device 316 may operate in the normal mode. In some cases, the fifth DRAM device 315 and the sixth DRAM device 316 may operate in a self-refresh mode by inverting a logic level of the clock enable signal CKE. However, the selection signal SEL may not affect operations of the fifth DRAM device 315 and the sixth DRAM device 316.

In some exemplary embodiments, one or more target DRAM devices respectively included in the one or more DRAM groups may buffer first data (i.e., "cold data") that is not frequently accessed. Furthermore, one or more general DRAM devices may buffer second data (i.e., "hot data") that is relatively frequently accessed. The second data buffered by the one or more general DRAM devices may be accessed more frequently than the first data buffered by the one or more target DRAM devices.

A DRAM device included in the one or more DRAM groups may operate as a target DRAM device or a stand-by DRAM device. As described with reference to FIGS. 5 and 6, it may be necessary to convert operation modes to read data buffered by a stand-by DRAM device. Accordingly, it may be efficient to buffer hot data in a general DRAM device that operates regardless of the selection signal SEL.

Referring to FIG. 8, in operation S210, input data may be provided to a memory system 300. In operation S220, it may be determined whether the input data is hot data according to a control of a DRAM controller 330. When the input data is hot data, operation S230 may be performed. On the other hand, when the input data is cold data, operation S240 may be performed. Whether the input data is hot data or cold data may be determined based on various conditions, such as an operation policy of the memory system 300, an access count associated with the input data, a recent access time of the input data, and so on.

In operation S230, the input data may be buffered by a general DRAM device (e.g., a fifth DRAM device 315 or a sixth DRAM device 316 illustrated in FIG. 7). In the case where the input data is hot data, it is highly expected that the input data is accessed soon again. Accordingly, the general DRAM device may buffer the input data as the second data. The general DRAM device may operate in a normal mode without conversion of an operation mode. Accordingly, when hot data is buffered by the general DRAM device, the hot data may be efficiently accessed.

In operation S240, the input data may be buffered by a target DRAM device. In the case where the input data is cold data, the input data may not be frequently accessed. The target DRAM device may be changed into a stand-by DRAM device by the conversion of the operation mode. It may be fine that cold data is buffered as the first data by the target DRAM device.

However, the present disclosure is not limited to an exemplary embodiment described with reference to FIGS. 7 and 8. In FIG. 7, the plurality of DRAM devices 310 may be illustrated as including two general DRAM devices, but the number of general DRAM devices may be variously changed or modified. Furthermore, in the case where the plurality of DRAM devices 310 includes one or more general DRAM devices, the use of the general DRAM devices may be variously changed or modified. An exemplary embodiment described with reference to FIGS. 7 and 8 may be an exemplary for implementing a memory system of the present disclosure.

Figure 9:
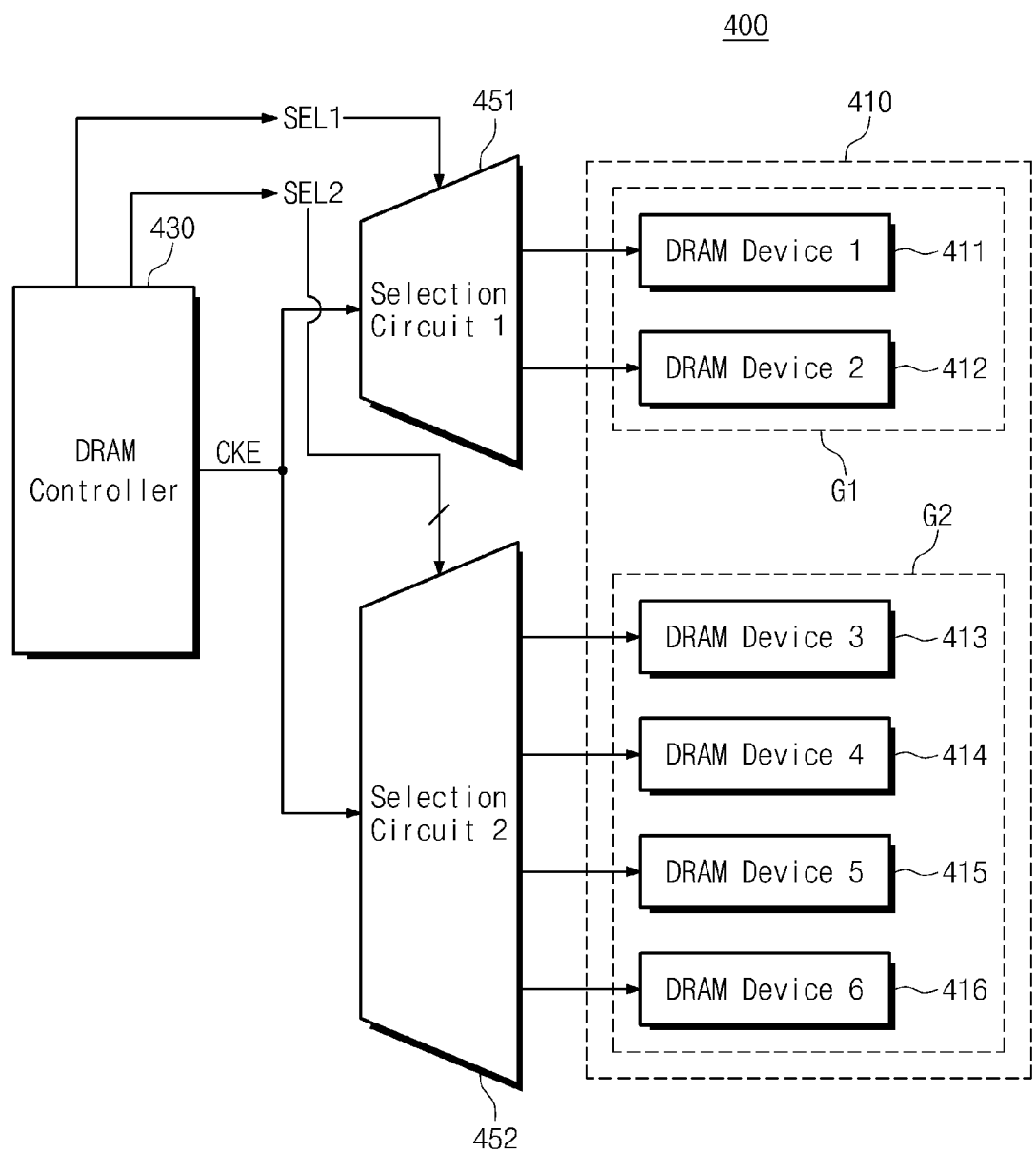
FIG. 9 is a block diagram illustrating a memory system according to an exemplary embodiment.

FIG. 9 is a block diagram illustrating a memory system according to an exemplary embodiment. A memory system 400 may include a plurality of DRAM devices 410, a DRAM controller 430, and selection circuits 451 and 452. The memory system 400 may be used as a working memory, a buffer memory, or an operation memory of a computing device or an electronic system.

The plurality of DRAM devices 410 may include one or more DRAM groups. For instance, the plurality of DRAM devices 410 may include two DRAM groups G1 and G2. One DRAM group may include at least two DRAM devices. For instance, a first DRAM group G1 may include two DRAM devices 411 and 412, and a second DRAM group G2 may include four DRAM devices 413, 414, 415, and 416.

However, the present disclosure is not limited to a configuration illustrated in FIG. 9. For instance, the plurality of DRAM devices 410 may include one DRAM group or three or more DRAM groups. For instance, one DRAM group may include three DRAM devices or five or more DRAM devices. A configuration illustrated in FIG. 9 is an example to help understanding of the present disclosure. The number of DRAM groups included in the plurality of DRAM devices 410 and the number of DRAM devices included in one DRAM group may be variously changed or modified.

The DRAM controller 430 may output a clock enable signal CKE to be provided to the plurality of DRAM device 410. Furthermore, in an exemplary embodiment, the DRAM controller 430 may control selection signals SEL1 and SEL2. Similarly to a selection signal SEL described with reference to FIGS. 1 to 8, each of the selection signals SEL1 and SEL2 may be used to select a target DRAM device from a corresponding one of the DRAM groups G1 and G2. Similarly to the selection signal SEL described with reference to FIGS. 1 to 8, the selection signals SEL1 and SEL2 may be implemented variously according to a design of the memory system 400.

For instance, the first selection signal SEL1 may be used to select one of the first DRAM device 411 and the second DRAM device 412 included in the first DRAM group G1 as a target DRAM device. The second selection signal SEL2 may be used to select one of the third to sixth DRAM devices 413 to 416 included in the second DRAM group G2 as a target DRAM device. Target DRAM devices may operate in a normal mode.

Furthermore, a remaining DRAM device other than the target DRAM device among the first DRAM device 411 and the second DRAM device 412 may operate in a self-refresh mode as a stand-by DRAM device. Remaining DRAM devices other than the target DRAM device among the third to sixth DRAM devices 413 to 416 may operate in the self-refresh mode as stand-by DRAM devices.

The selection circuits 451 and 452 may receive a clock enable signal CKE from the DRAM controller 430. The selection circuits 451 and 452 may respectively provide the clock enable signal CKE to target DRAM devices respectively selected from the DRAM groups G1 and G2 in response to the selection signals SEL1 and SEL2. For instance, the first selection circuit 451 may provide the clock enable signal CKE to a target DRAM device selected from the first DRAM group G1 in response to the first selection signal SEL1 The second selection circuit 452 may provide the clock enable signal CKE to a target DRAM device selected from the second DRAM group G2 in response to the second selection signal SEL2.

However, the present disclosure is not limited to a configuration illustrated in FIG. 9. In FIG. 9, the memory system 400 is illustrated as including two selection circuits 451 and 452, but the number of selection circuits may be variously changed or modified. For instance, the memory system 400 may include one selection circuit (this configuration may be similar to that illustrated in FIG. 1). Alternatively, the memory system 400 may include three or more selection circuits. However, the number of selection circuits may be the same as the number of DRAM groups included in the plurality of DRAM devices 410.

Furthermore, an exemplary embodiment in FIG. 9 has been described as two selection signals SEL1 and SEL2 are employed, but the number of selection signals may be variously changed or modified. However, the selection signals may be generated and controlled as many as the number of selection circuits. Thus, one selection circuit may provide the clock enable signal CKE to one corresponding DRAM group in response to one selection signal. Furthermore, one of DRAM devices included in one DRAM group may be selected as a target DRAM device based on one selection signal.

As described above, the clock enable signal CKE may not be provided to stand-by DRAM devices. The stand-by DRAM devices may operate in the self-refresh mode without the clock enable signal CKE. For instance, the memory system 400 may include a stabilization circuit, which is configured to provide a self-refresh signal to the plurality of DRAM devices 410, to stabilize operations of the stand-by DRAM devices. The stabilization circuit has been described with reference to FIGS. 3 and 4.

For instance, the selection circuits 451 and 452 may include de-multiplexers that operate in response to the selection signals SEL1 and SEL2. However, the present disclosure is not limited thereto. The selection circuits 451 and 452 may be implemented with various circuits, such as switch circuits, gate circuits, and so on.

For instance, in some cases, conversion of operation modes of the plurality of DRAM devices 410 may be required. In some exemplary embodiments, the conversion of the operation modes may be required when an available storage capacity of the plurality of DRAM devices 410 is insufficient or an access to a stand-by DRAM device is requested. This has been described with reference to FIGS. 5 and 6.

Unlike an exemplary embodiment illustrated in FIG. 1, in an exemplary embodiment illustrated in FIG. 9, selection circuits may operate in response to different selection signals. According to an exemplary embodiment illustrated in FIG. 9, the conversion of the operation modes may be independently performed with respect to DRAM groups respectively corresponding to the selection circuits. For instance, conversion of an operation mode associated with the first DRAM group G1 may be performed based on the first selection signal SEL1, and conversion of an operation mode associated with the second DRAM group G2 may be performed based on the second selection signal SEL2. The conversion of the operation mode associated with the first DRAM group G1 may be independently performed from the conversion of the operation mode associated with the second DRAM group G2. According to an exemplary embodiment illustrated in FIG. 9, thus, it may be possible to control an operation of the memory system 400 more flexibly.

According to an exemplary embodiment illustrated in FIG. 9, two or more DRAM groups may include the different number of DRAM devices. Accordingly, a configuration of the memory system 400 may be more flexibly designed. However, the present disclosure is not limited to a configuration illustrated in FIG. 9. In other exemplary embodiments, two or more DRAM groups may include the same number of DRAM devices.

In some exemplary embodiments, the plurality of DRAM devices 410 may further include one or more general DRAM devices that are not included in one or more DRAM groups. Configurations and operations of the general DRAM devices have been described with reference to FIGS. 7 and 8.

According to an exemplary embodiment described with reference to FIG. 9, it may be possible to implement the memory system 400 having a buffering capacity larger than that is able to be recognized or supported by the DRAM controller 430. Furthermore, according to an exemplary embodiment illustrated in FIG. 9, it may be possible to obtain the memory system 400 configured or controlled flexibly.

Figure 10:
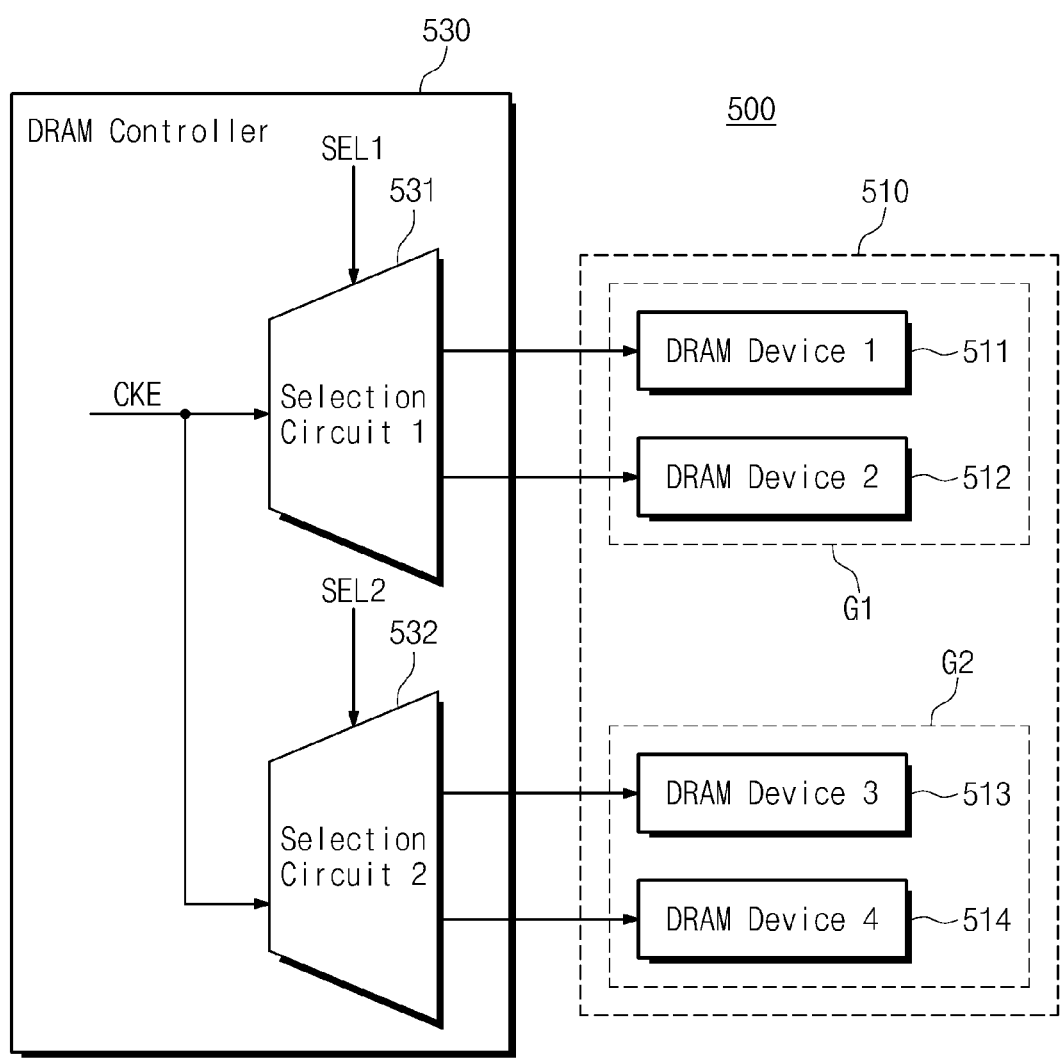
FIG. 10 is a block diagram illustrating a memory system according to an exemplary embodiment.

FIG. 10 is a block diagram illustrating a memory system according to an exemplary embodiment. A memory system 500 may include a plurality of DRAM devices 510 and a DRAM controller 530. The memory system 500 may be used as a working memory, a buffer memory, or an operation memory of a computing device or an electronic system.

The plurality of DRAM devices 510 may include one or more DRAM groups. For instance, the plurality of DRAM devices 510 may include two DRAM groups G1 and G2. One DRAM group may include at least two DRAM devices. For instance, a first DRAM group G1 may include two DRAM devices 511 and 512, and a second DRAM group G2 may include two DRAM devices 513 and 514.

However, the present disclosure is not limited to a configuration illustrated in FIG. 1. For instance, the plurality of DRAM devices 510 may include one DRAM group or three or more DRAM groups. For instance, one DRAM group may include three or more DRAM devices. A configuration illustrated in FIG. 10 is an example to help understanding of the present disclosure. The number of DRAM groups and the number of DRAM devices per DRAM group may be variously changed or modified.

The DRAM controller 530 may output a clock enable signal CKE to be provided to the plurality of DRAM devices 510. Furthermore, in an exemplary embodiment, the DRAM controller 530 may control selection signals SEL1 and SEL2. Each of the selection signals SEL1 and SEL2 may be used to select a target DRAM device from a respective one of the DRAM groups G1 and G2. Similarly to a selection signal SEL described with reference to FIGS. 1 to 8, the selection signals SEL1 and SEL2 may be implemented variously according to a design of the memory system 500.

The DRAM controller 530 may provide the clock enable signal CKE to the plurality of DRAM device 510. More particularly, the DRAM controller 530 may provide the clock enable signal CKE to target DRAM devices respectively selected from the DRAM groups. The target DRAM devices may operate in a normal mode in response to the clock enable signal CKE. The clock enable signal CKE may not be provided to stand-by DRAM devices other than the target DRAM devices. The stand-by DRAM devices may operate in a self-refresh mode without the clock enable signal CKE.

As an exemplary embodiment, the DRAM controller 530 may include selection circuits 531 and 532. The selection circuits 531 and 532 may provide the clock enable signal CKE to the target DRAM devices respectively selected from the DRAM groups G1 and G2 in response to the selection signals SEL1 and SEL2, respectively.

However, the present disclosure is not limited by a configuration illustrated in FIG. 10. FIG. 10 illustrates that the memory system 500 includes two selection circuits 531 and 532, but the number of selection circuits may be variously changed or modified. For instance, the memory system 500 may include one selection circuit (this configuration may be similar to that illustrated in FIG. 1). Alternatively, the memory system 500 may include three or more selection circuits. The number of selection circuits may be the same as the number of DRAM groups included in the plurality of DRAM devices 510.

Furthermore, an exemplary embodiment in FIG. 10 is described that two selection signals SEL1 and SEL2 are employed, but the number of selection signals may be variously changed or modified. However, the selection signals may be generated and controlled as many as the number of selection circuits. Thus, one selection circuit may provide the clock enable signal CKE to one corresponding DRAM group in response to one selection signal. Furthermore, one of DRAM devices included in one DRAM group may be selected as a target DRAM device based on one selection signal.

As described above, the clock enable signal CKE may not be provided to stand-by DRAM devices. The stand-by DRAM devices may operate in a self-refresh mode without the clock enable signal CKE. In some exemplary embodiments, the memory system 500 may include a stabilization circuit, which is configured to provide a self-refresh signal to the plurality of DRAM devices 510, to stabilize operations of the stand-by DRAM devices. The stabilization circuit has been described with reference to FIGS. 3 and 4.

For instance, the selection circuits 531 and 532 may include de-multiplexers that operate in response to the selection signals SEL1 and SEL2. However, the present disclosure is not limited thereto. The selection circuits 531 and 532 may be implemented with various circuits, such as switch circuits, gate circuits, and so on.

In some cases, conversion of operation modes of the plurality of DRAM devices 510 may be required. As an exemplary embodiment, the conversion of the operation modes may be required when an available storage capacity of the plurality of DRAM devices 510 is insufficient or an access to a stand-by DRAM device is requested. This has been described with reference to FIGS. 5 and 6. In an exemplary embodiment illustrated in FIG. 10, the conversion of the operation modes may be independently performed with respect to each of DRAM groups respectively corresponding to selection circuits.

In some exemplary embodiments, the plurality of DRAM devices 510 may further include one or more general DRAM devices that are not included in one or more DRAM groups. Configurations and operations of the general DRAM devices have been described with reference to FIGS. 7 and 8.

According to an exemplary embodiment described with reference to FIG. 10, it is possible to implement the memory system 500 having a buffering capacity larger than that is able to be recognized or supported by the DRAM controller 530. Furthermore, according to an exemplary embodiment illustrated in FIG. 10, it is possible to obtain the memory system 500 configured or controlled flexibly.

In particular, as illustrated in FIG. 10, in the case where the selection circuits 531 and 532 are included in the DRAM controller 530, an area occupied by the memory system 500 may be reduced. According to an exemplary embodiment illustrated in FIG. 10, the memory system 500 may be implemented, without redesigning a core of the DRAM controller 530, by adding the selection circuits 531 and 532 in front of a terminal for outputting the clock enable signal CKE.

Figure 11:
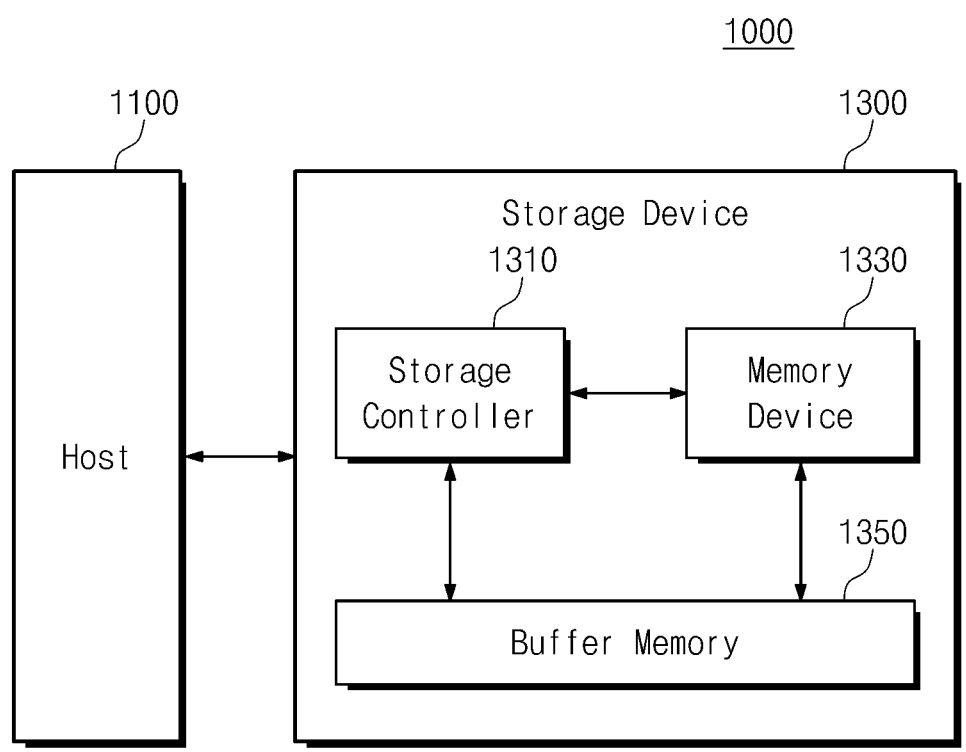
FIG. 11 is a block diagram illustrating a storage device and a storage system including a buffer memory according to an exemplary embodiment.

FIG. 11 is a block diagram illustrating a storage device and a storage system including a buffer memory according to an exemplary embodiment. A storage system 1000 may include a host 1100 and a storage device 1300.

The host 1100 may store data at the storage device 1300 or may read data from the storage device 1300. For instance, the host 1100 may be a computing device including one or more processor cores. Alternatively, the host 1100 may be a mobile electronic device including an application processor.

The storage device 1300 may include a storage controller 1310, a memory device 1330, and a buffer memory 1350. However, the storage device 1300 may further include components not illustrated in FIG. 11. A configuration illustrated in FIG. 11 is an example to help understanding of the present disclosure. The storage device 1300 may be, for instance, a semiconductor device, such as a solid state drive (SSD), an embedded multimedia card (eMMC), or the like.

The storage controller 1310 may control overall operations of the storage device 1300. The storage controller 1310 may process and manage data exchanged with the host 1100. The storage device 1300 may perform its own function according to a control of the storage controller 1310. For instance, the storage controller 1310 may control the storage device 1300 in compliance with one or more of various interface protocols, such as universal serial bus (USB), small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), universal flash storage (UFS), and the like.

The memory device 1330 may include a nonvolatile memory that is configured to store data regardless of whether a power is supplied. For instance, the memory device 1330 may include at least one of nonvolatile memories, such as a flash memory, a phase-change RAM (PRAM), a magneto-resistive RAM (MRAM), a resistive RAM (ReRAM), a ferroelectric RAM (FRAM), and the like. The memory device 1330 may store data according to a control of the storage controller 1310. The memory device 1330 may output data according to a control of the storage controller 1310.

The buffer memory 1350 may include a volatile memory configured to temporarily store data. The buffer memory 1350 may store at least one of data used for an operation of the storage device 1300, data to be stored at the memory device 1330, and data read from the memory device 1330. The buffer memory 1350 may include, for instance, a volatile memory system, such as a DRAM, a synchronous DRAM (SDRAM), or the like.

The buffer memory 1350 may be implemented according to an exemplary embodiment of the present disclosure. The buffer memory 1350 may be configured to allow a part of a plurality of memory devices to selectively operate in a normal mode with using a selection signal and a selection circuit. Exemplary embodiments have been described with reference to FIGS. 1 to 10, and redundant descriptions thereof will be thus omitted below for brevity of the description.

Figure 12:
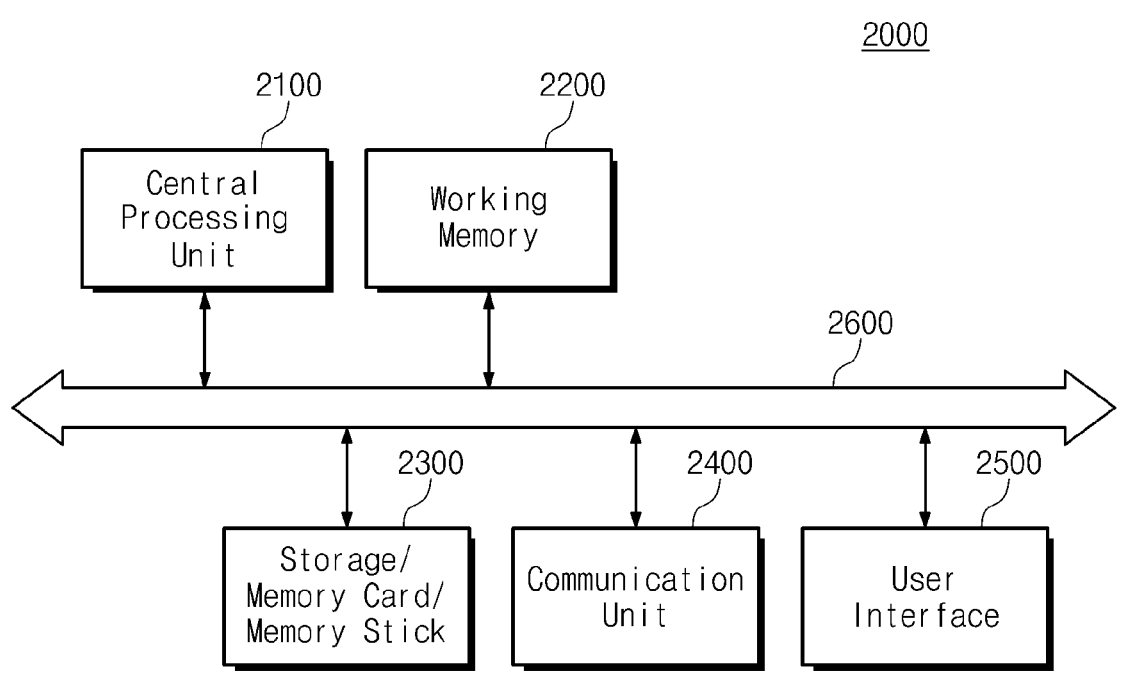
FIG. 12 is a block diagram illustrating a computing device including a working memory according to an exemplary embodiment.

FIG. 12 is a block diagram illustrating a computing device including a working memory according to an exemplary embodiment. A computing device 2000 may include a central processing unit 2100, a working memory 2200, a storage unit 2300, a communication unit 2400, a user interface 2500, and a bus 2600. The computing device 2000 may be, for instance, one of a personal computer, a workstation, a notebook computer, and the like.

The central processing unit 2100 may control overall operations of the computing system 2000. The central processing unit 2100 may perform various kinds of arithmetic operations, logical operations, and the like. The central processing unit 2100 may include, for instance, one or more processor cores used as a general-purpose processor.

The working memory 2200 may exchange data with the central processing unit 2100. The working memory 2200 may temporarily store data used for an operation of the computing device 2000. The working memory 2200 may include, for instance, a volatile memory system such as a DRAM, an SDRAM, or the like. The working memory 2200 may include one or more memory modules or one or more memory packages.

The working memory 2200 may be implemented according to an exemplary embodiment. The working may be configured to allow a part of a plurality of memory devices to selectively operate in a normal mode with using a selection signal and a selection circuit. Exemplary embodiments have been described with reference to FIGS. 1 to 10, and redundant descriptions thereof will be thus omitted below for brevity of the description.

The storage unit 2300 may store data that needs to be retained regardless of whether power is supplied. The storage unit 2300 may include, for instance, at least one of nonvolatile memories, such as a flash memory, a PRAM, an MRAM, a ReRAM, a FRAM, and the like. The storage unit 2300 may include, for instance, at least one of a storage device such as an SSD, a memory card such as an eMMC, and a memory stick.

The communication unit 2400 may communicate with an external device or system of the computing device 2000 according to a control of the central processing unit 2100. For instance, the communication unit 2400 may communicate with the external device or system in compliance with a wired communication protocol, such as USB, SCSI, PCIe, ATA, PATA, SATA, SAS, IDE, UFS, and Firewire, and/or a wireless communication protocol, such as long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The user interface 2500 may control communication between a user and the computing device 2000 under a control of the central processing unit 2100. For instance, the user interface 2500 may include user input interfaces such as a keyboard, a keypad, a button, a touch panel, a touch screen, a touch pad, a touch ball, a camera, a microphone, a gyroscope sensor, and a vibration sensor. The user interface 2500 may further include user output interfaces such as a liquid crystal display (LCD) device, a light emitting diode (LED) display device, an organic LED (OLED) display device, an active matrix OLED (AMOLED) display device, a speaker, and a motor.

The bus 2600 may provide communication paths between components of the computing device 2000. The components of the computing device 2000 may exchange data with each other in compliance with a bus format. The bus format may include, for instance, USB, SCSI, PCIe, ATA, PATA, SATA, SAS, IDE, and the like.

Figure 13:
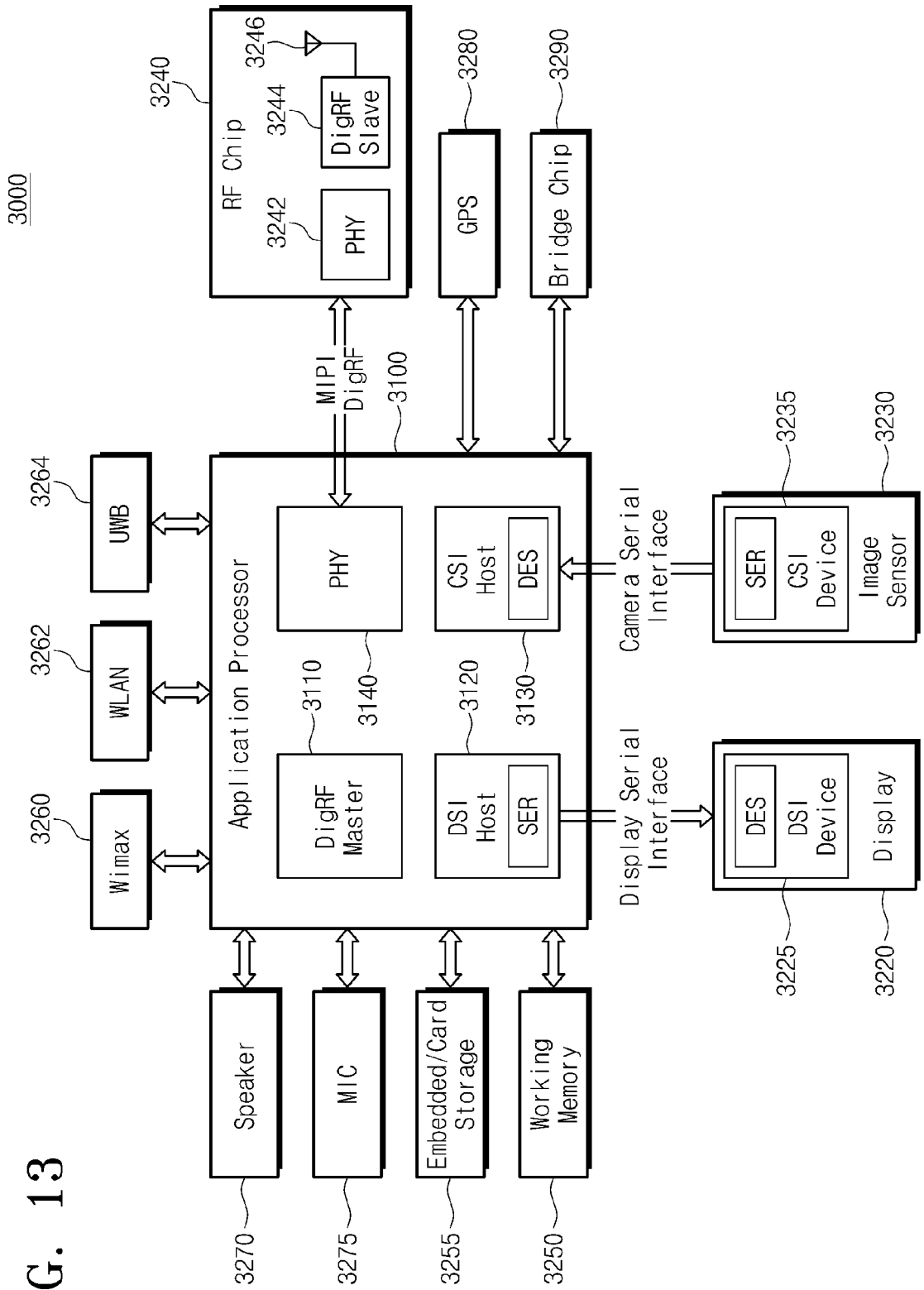
FIG. 13 is a block diagram illustrating an electronic system including a working memory and interfaces thereof, according to an exemplary embodiment.

FIG. 13 is a block diagram illustrating an electronic system including a working memory and interfaces thereof, according to an exemplary embodiment. Referring to FIG. 13, an electronic system 3000 may be implemented with a data processing device (e.g., a cellular phone, a personal digital assistant (PDA), a portable media player (PMP), a smart phone, a wearable device, or the like) capable of using or supporting a mobile industry processor interface (MIPI) that the MIPI Alliance proposes.

The electronic system 3000 may include an application processor 3100, a display 3220, and an image sensor 3230. The application processor 3100 may include a DigRF master 3110, a display serial interface (DSI) host 3120, a camera serial interface (CSI) host 3130, and a physical layer 3140.

The DSI host 3120 may communicate with a DSI device 3225 of the display 3220 in compliance with DSI. For instance, an optical serializer SER may be implemented in the DSI host 3120, and an optical de-serializer DES may be implemented in the DSI device 3225.

The CSI host 3130 may communicate with a CSI device 3235 of the image sensor 3230 in compliance with CSI. An optical serializer SER may be implemented in the CSI device 3235, and an optical de-serializer DES may be implemented in the CSI host 3130.

The electronic device 3000 may further include a radio frequency (RF) chip 3240 capable of communicating with the application processor 3100. The RF chip 3240 may include a physical layer 3242, a DigRF slave 3244, and an antenna 3246. For instance, the physical layer 3242 of the RF chip 3240 and the physical layer 3140 of the application processor 3100 may exchange data through a DigRF interface proposed by the MIPI Alliance The electronic system 3000 may further include a working memory 3250 and an embedded/card storage 3255. The working memory 3250 and the embedded/card storage 3255 may store data provided from the application processor 3100. Furthermore, the working memory 3250 and the embedded/card storage 3255 may provide data stored therein to the application processor 3100. The embedded/card storage 3255 may store data regardless of whether power is supplied.

The working memory 3250 may temporarily store data processed or to be processed by the application processor 3100. The working memory 3250 may include a volatile memory system, such as a DRAM, a SDRAM, or the like. The working memory 3250 may be implemented according to an exemplary embodiment. The working memory 3250 may be configured to allow a part of a plurality of memory devices to selectively operate in a normal mode with using a selection signal and a selection circuit. Exemplary embodiments have been described with reference to FIGS. 1 to 10, and redundant descriptions thereof will be thus omitted below for brevity of the description.

The electronic system 3000 may communicate with an external system (not illustrated) through WiMax 3260, wireless local area network (WLAN) 3262, and ultra wideband (UWB) 3264. The electronic system 3000 may further include a speaker 3270 and a microphone 3275 to process voice information. The electronic system 3000 may further include a global positioning system (GPS) device 3280 for processing position information. The electronic system 3000 may further include a bridge chip 3290 for managing connection with peripheral devices.

Memories and circuits according to an exemplary embodiment may be packaged according to any of a variety of different packaging technologies. Examples of such packaging technologies may include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), metric quad flat pack (MQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP), and wafer-level processed stack package (WSP).

According to an exemplary embodiment, it may be possible to obtain a memory system having a buffering capacity larger than that is able to be recognized or supported by a DRAM controller. In particular, it may be possible to obtain the memory system according to an exemplary embodiment without redesigning the DRAM controller. Accordingly, time and cost may not be consumed to redesign the DRAM controller.

A configuration illustrated in each conceptual diagram should be understood just from a conceptual point of view. Shape, structure, and size of each component included in each conceptual diagram are exaggerated or downsized for understanding of the present disclosure. An actually implemented configuration may have a physical shape different from a configuration of each conceptual diagram. The present disclosure is not limited to a physical shape or size illustrated in each conceptual diagram.

A device configuration illustrated in each block diagram is provided to help understanding of the present disclosure. Each block may include smaller blocks according to a function. Alternatively, a plurality of blocks may form a large block according to a function. That is, the present disclosure is not limited to components illustrated in each block diagram.

While the present disclosure has been described with reference to exemplary embodiments, it will be apparent to those skilled in the art that various changes and modifications may be made without departing from the spirit and scope of the present disclosure. Therefore, it should be understood that the above embodiments are not limiting, but illustrative.

What is claimed is:

1. A memory system comprising:
   a plurality of dynamic random access memory (DRAM) devices including one or more DRAM groups, each of the one or more DRAM groups including at least two DRAM devices;
   a plurality of stabilization circuits configured to provide a self-refresh signal to the plurality of DRAM devices; and
   a DRAM controller configured to:

output a clock enable signal, and
control a selection signal used to select at least one target DRAM device that operates in a normal mode in response to the clock enable signal, the at least one target DRAM device being selected from each one of the one or more DRAM groups,
wherein at least one stand-by DRAM device other than the at least one target DRAM device operates in a self-refresh mode in response to the selection signal based on the self-refresh signal, when the at least one target DRAM device operates in the normal mode.

2. The memory system of claim 1, wherein the selection signal comprises at least one of general-purpose input/output (GPIO) signals other than signals used for interfacing between the plurality of DRAM devices and the DRAM controller from among signals output from the DRAM controller.

3. The memory system of claim 1, further comprising:
a selection circuit configured to:
receive the clock enable signal from the DRAM controller, and
provide the clock enable signal to the at least one target DRAM device in response to the selection signal.

4. The memory system of claim 3, wherein each of the plurality of DRAM devices is configured to operate in the normal mode in response to a first logic level of the clock enable signal and to operate in the self-refresh mode in response to a second logic level of the clock enable signal.

5. The memory system of claim 3, wherein the selection circuit is configured not to provide the clock enable signal to the at least one stand-by DRAM device.

6. The memory system of claim 3,
wherein the self-refresh signal has a same level as a logic level of the clock enable signal used in an operation of the self-refresh mode.

7. The memory system of claim 6, wherein the plurality of stabilization circuits is configured to provide the self-refresh signal to the at least one stand-by DRAM device in response to the selection signal.

8. The memory system of claim 7, wherein the at least one target DRAM device operates in the normal mode in response to the clock enable signal received from the DRAM controller through the selection circuit, and
wherein the at least one stand-by DRAM device operates in the self-refresh mode in response to the self-refresh signal provided from the plurality of stabilization circuits.

9. The memory system of claim 1, wherein in response to an available capacity of the at least one target DRAM device being insufficient or an access to at least one of the at least one stand-by DRAM device being requested, the DRAM controller is configured to determine to operate the at least one stand-by DRAM device in the normal mode.

10. The memory system of claim 9, wherein in response to the DRAM controller determining to operate the at least one stand-by DRAM device in the normal mode, the DRAM controller is configured to:
invert a logic level of the clock enable signal, such that the at least one target DRAM device operates in the self-refresh mode;
change the selection signal, such that the clock enable signal is transferred to the at least one stand-by DRAM device; and
re-invert the logic level of the clock enable signal, such that the at least one stand-by DRAM device operates in the normal mode.

11. The memory system of claim 1, wherein the plurality of DRAM devices further comprises:
at least one general DRAM device that is not included in the one or more DRAM groups.

12. The memory system of claim 11, wherein the at least one general DRAM device is configured to operate regardless of the selection signal.

13. The memory system of claim 11, wherein the at least one target DRAM device is configured to buffer first data and the at least one general DRAM device is configured to buffer second data, and
wherein the second data is accessed more frequently than the first data.

14. A memory system comprising:
a plurality of dynamic random access memory (DRAM) devices including one or more DRAM groups, each of the one or more DRAM groups including at least two DRAM devices;
a plurality of stabilization circuits configured to provide a self-refresh signal to the plurality of DRAM devices; and
a DRAM controller configured to:
output a clock enable signal, and
control one or more selection signals, each of the one or more selection signals being used to select at least one target DRAM device that operates in a normal mode in response to the clock enable signal, the at least target DRAM device being selected from a corresponding one of the one or more DRAM groups,
wherein at least one stand-by DRAM device other than the at least one target DRAM device operates in a self-refresh mode in response to the selection signal based on the self-refresh signal, when the at least one target DRAM device operates in the normal mode.

15. The memory system of claim 14, wherein one DRAM device that is selected from among the at least two DRAM devices included in one of the one or more DRAM groups based on one of the one or more selection signals operates in the normal mode as at least one target DRAM device, and
wherein one or more remaining DRAM devices other than the one DRAM device operating in the normal mode from among the at least two DRAM devices included in the one of the one or more DRAM groups operate in the self-refresh mode as the at least one stand-by DRAM device.

16. A memory system comprising:
a selection circuit comprising a plurality of selectors configured to select target dynamic random access memory (DRAM) devices from among a plurality of DRAM devices;
a plurality of stabilization circuits configured to provide a self-refresh signal to the plurality of DRAM devices; and
a DRAM controller configured to output a clock enable signal to the selection circuit and output a selection signal to select the target DRAM devices,
wherein the plurality of selectors is configured to select the target DRAM devices in response to the selection signal,
wherein the target DRAM devices are configured to operate in a normal mode in response to the clock enable signal, and
wherein one or more stand-by DRAM devices other than the target DRAM devices are configured to operate in a self-refresh mode in response to the selection signal based on the self-refresh signal, when the target DRAM devices operate in the normal mode.

17. The memory system of claim 16, wherein the selection signal comprises at least one of general-purpose input/output (GPIO) signals other than signals used for interfacing between the plurality of DRAM devices and the DRAM controller from among signals output from the DRAM controller.

18. The memory system of claim 16, wherein the selection circuit is further configured to receive the clock enable signal from the DRAM controller and provide the clock enable signal to the target DRAM devices in response to the selection signal.

19. The memory system of claim 16, wherein the self-refresh signal has a same level as a logic level of the clock enable signal used in an operation of the self-refresh mode.

20. The memory system of claim 16, further comprising the plurality of DRAM devices.

* * * * *